United States Patent
Sawada et al.

(10) Patent No.: US 8,419,960 B2
(45) Date of Patent: Apr. 16, 2013

(54) PLASMA PROCESSING APPARATUS AND METHOD

(75) Inventors: Ikuo Sawada, Nirasaki (JP); Songyun Kang, Nirasaki (JP); Shigeru Kasai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 67 days.

(21) Appl. No.: 13/003,416

(22) PCT Filed: Jul. 7, 2009

(86) PCT No.: PCT/JP2009/062378
§ 371 (c)(1),
(2), (4) Date: Apr. 11, 2011

(87) PCT Pub. No.: WO2010/004997
PCT Pub. Date: Jan. 14, 2010

(65) Prior Publication Data
US 2011/0174778 A1   Jul. 21, 2011

(30) Foreign Application Priority Data

Jul. 11, 2008 (JP) ................................. 2008-182058
Sep. 30, 2008 (JP) ................................. 2008-254377

(51) Int. Cl.
*C03C 15/00* (2006.01)
(52) U.S. Cl.
USPC .................. 216/68; 156/345.18; 156/345.43; 156/345.44; 156/345.45; 156/345.49; 118/715; 118/722
(58) Field of Classification Search ............. 156/345.18, 156/345.43–345.49; 118/723.1, 715, 722; 216/68
See application file for complete search history.

(56) References Cited

U.S. PATENT DOCUMENTS 6,188,564 B1 * 2/2001 Hao .............................. 361/234
6,253,704 B1 * 7/2001 Savas .......................... 118/723 I
(Continued)

FOREIGN PATENT DOCUMENTS

| CN | 1663030 A | 8/2005 |
| CN | 1842243 | 10/2006 |

(Continued)

OTHER PUBLICATIONS

Pyo et al. Journal of Korean Physical Society, vol. 42, (2003), pp. s873,-s878.*

(Continued)

*Primary Examiner* — Lan Vinh
*Assistant Examiner* — Maki Angadi
(74) *Attorney, Agent, or Firm* — Oblon, Spivak, McClelland, Maier & Neustadt, L.L.P.

(57) ABSTRACT

A plasma processing apparatus performs a process on a substrate by using plasma. The plasma processing apparatus includes a processing chamber; a mounting table which is located in the processing chamber and on which a substrate is mounted; a gas shower head formed of a conductive material provided to face the mounting table and having at the bottom surface thereof a plurality of gas injection openings for supplying a processing gas into the processing chamber; an induction coil to which a high frequency current is supplied to generate an inductively coupled plasma in a region surrounding a space below the gas shower head; a negative voltage supplying unit for applying a negative DC voltage to the gas shower head to allow an electrical field, which is induced by the induction coil, to be drawn to a central portion of the processing region; and a unit for evacuating the processing chamber.

20 Claims, 30 Drawing Sheets

U.S. PATENT DOCUMENTS

| | | |
|---|---|---|
| 6,500,742 B1 * 12/2002 | Chern et al. | 438/582 |
| 6,511,575 B1 * 1/2003 | Kitagawa et al. | 355/30 |
| 6,983,892 B2 * 1/2006 | Noorbakhsh et al. | 239/67 |
| 7,540,923 B2 * 6/2009 | Takagi et al. | 118/666 |
| 2004/0003897 A1 * 1/2004 | Nishida et al. | 156/345.48 |
| 2005/0103748 A1 5/2005 | Yamaguchi et al. | |
| 2006/0219363 A1 10/2006 | Matsumoto et al. | |
| 2008/0185364 A1 8/2008 | Kon et al. | |
| 2008/0194114 A1 8/2008 | Yoshida | |

FOREIGN PATENT DOCUMENTS

| | | |
|---|---|---|
| JP | 6-291064 | 10/1994 |
| JP | 2000-12293 | 1/2000 |
| JP | 2004-95663 | 3/2004 |
| JP | 2008-109155 | 5/2008 |
| JP | 2008-192906 | 8/2008 |
| JP | 2008-198659 | 8/2008 |

OTHER PUBLICATIONS

Chinese Office Action issued in corresponding Chinese application, 200980127277.X dated Aug. 15, 2012.

* cited by examiner

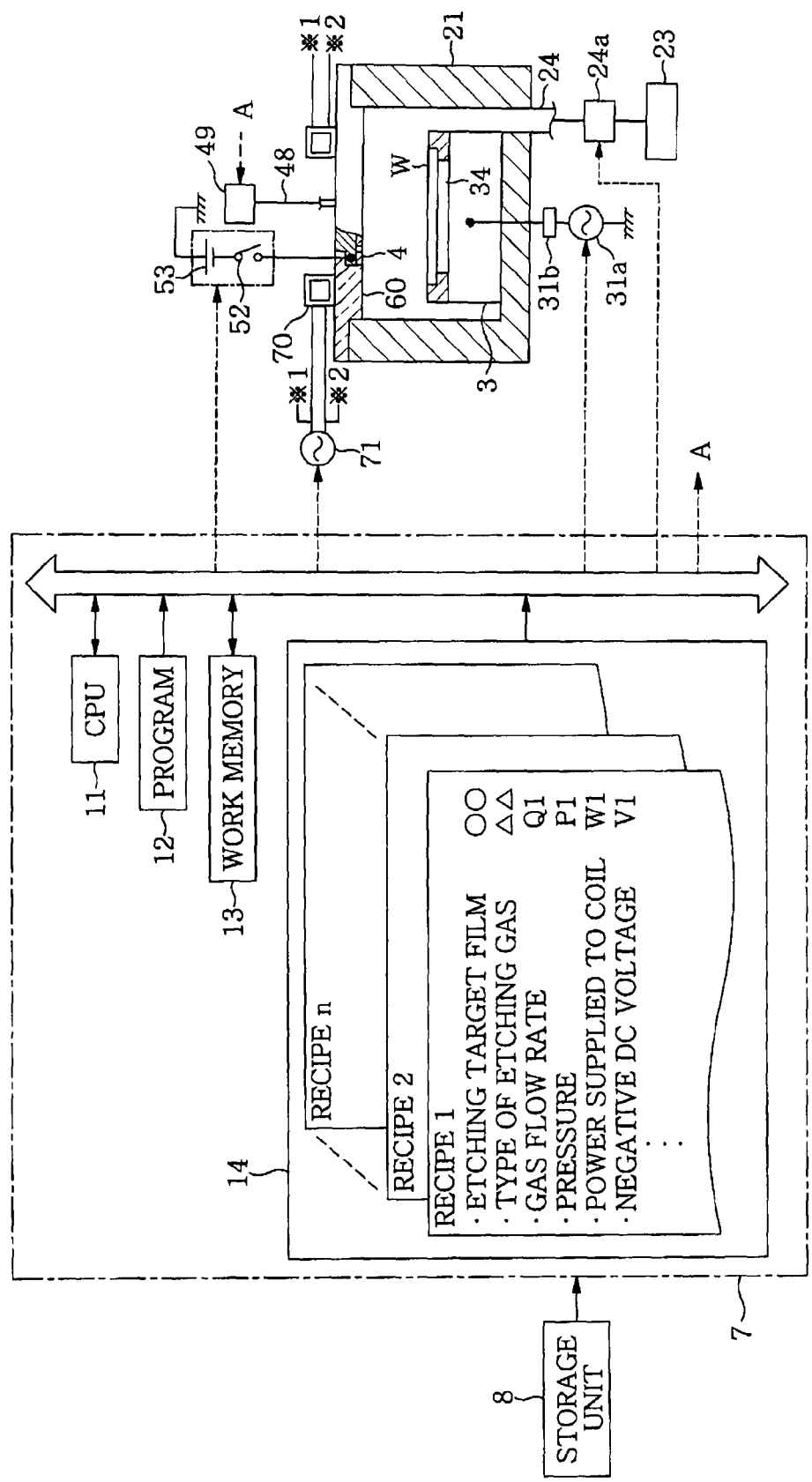

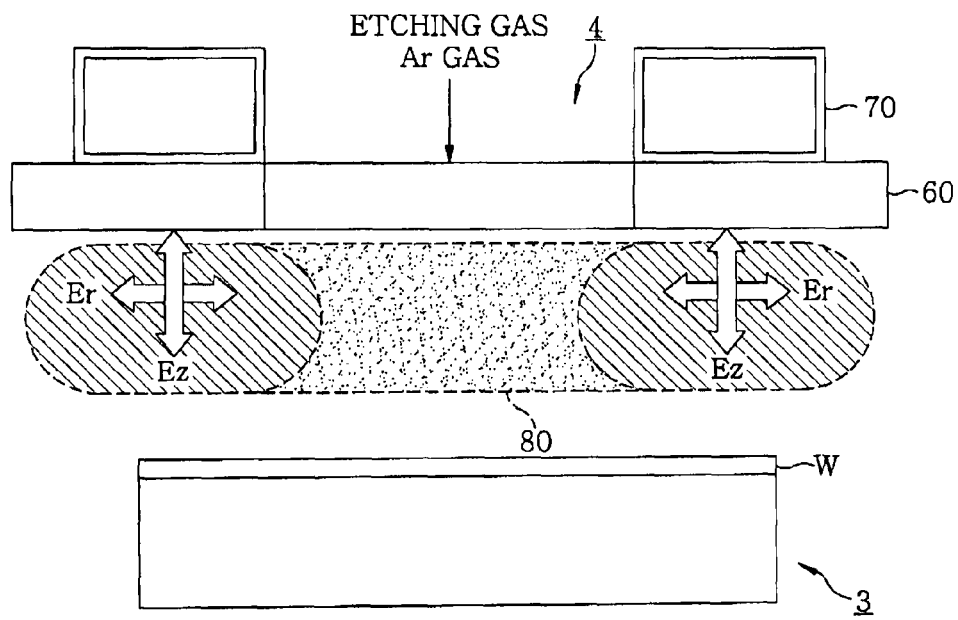
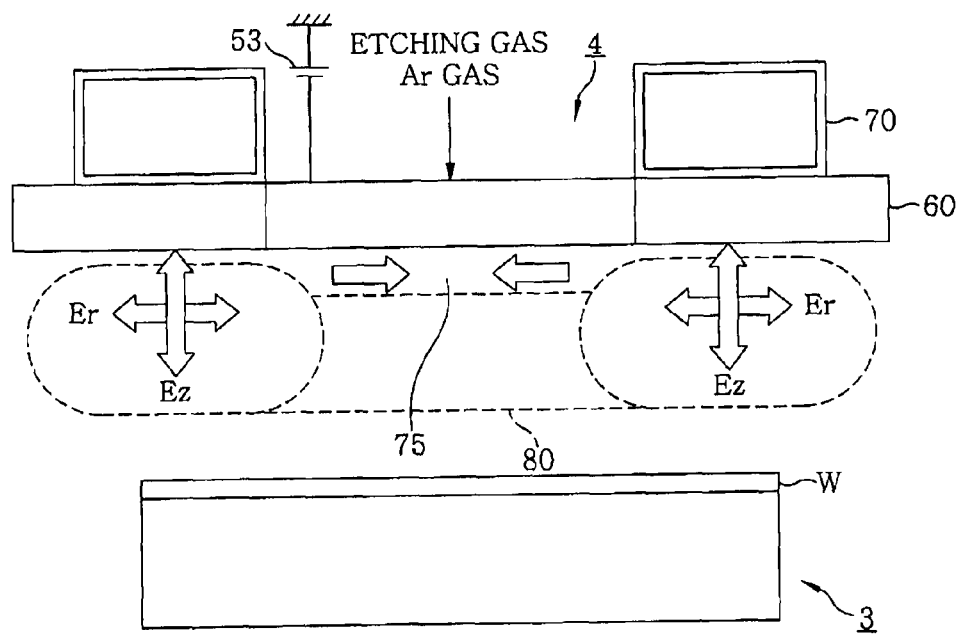

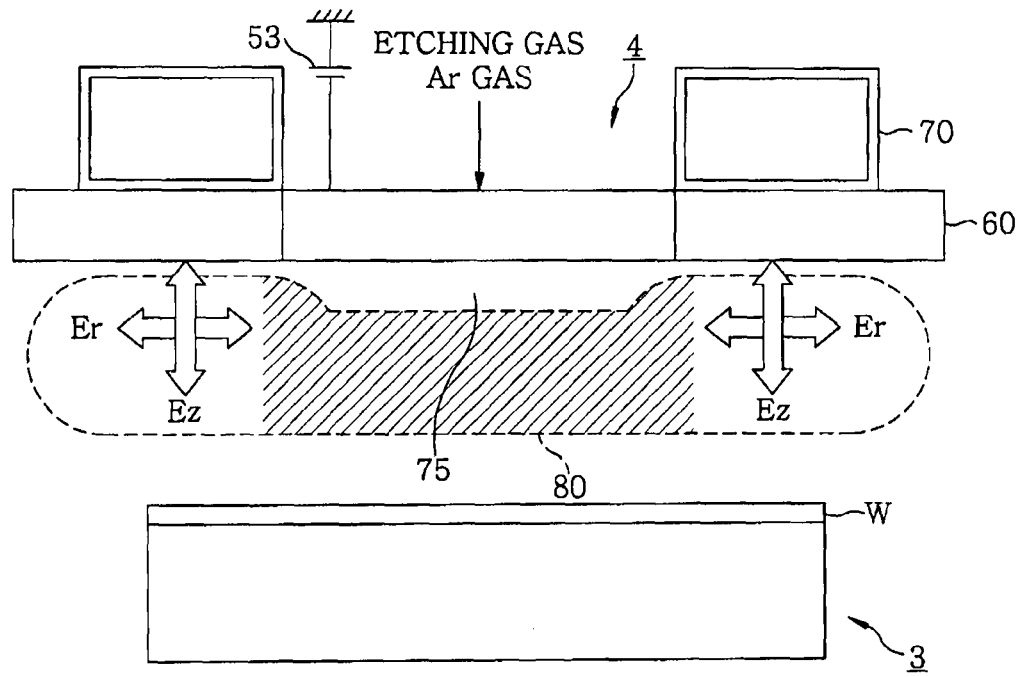
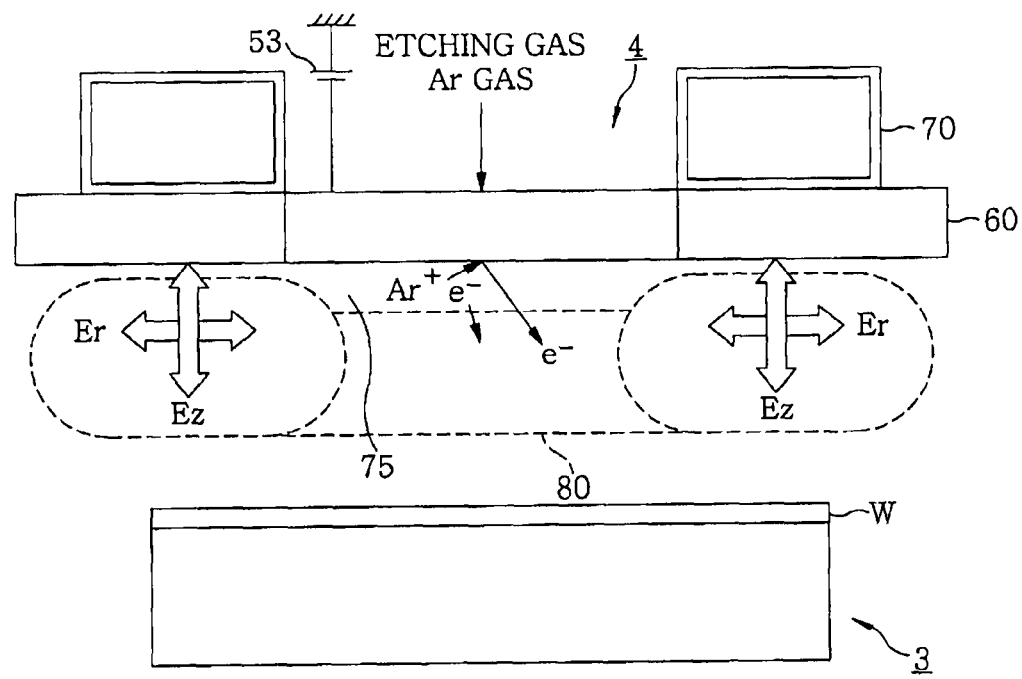

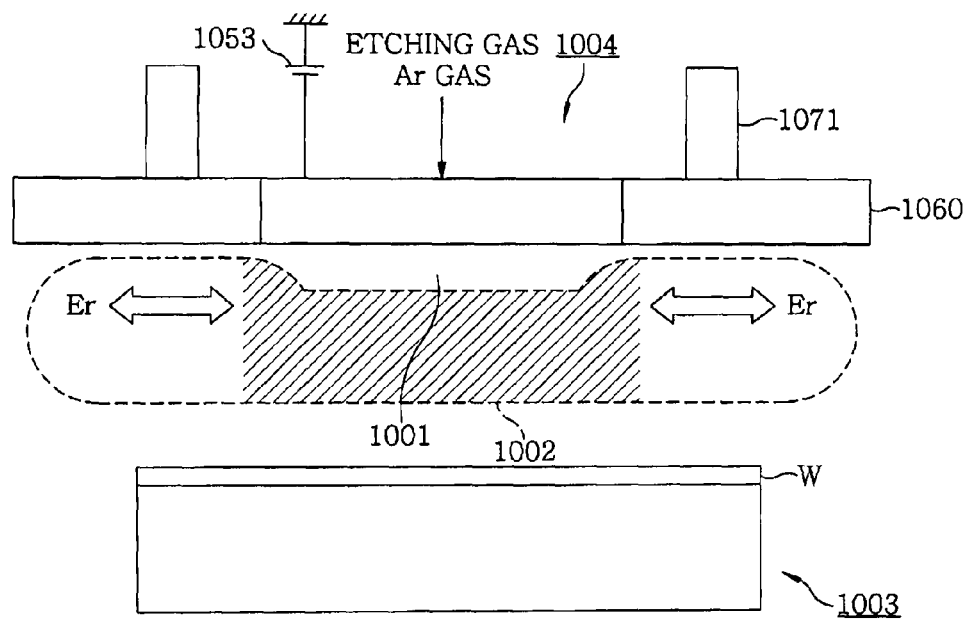
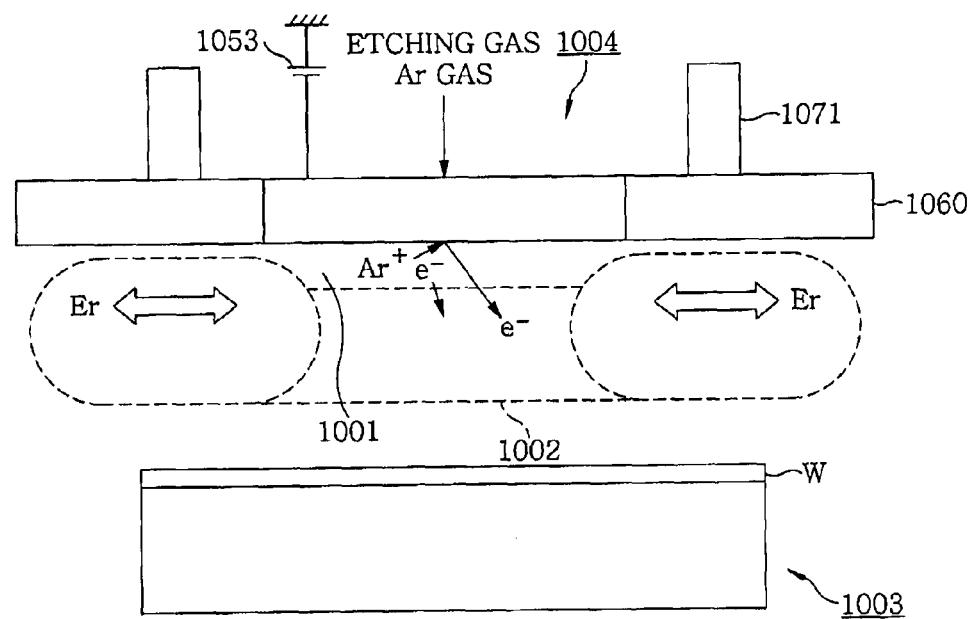

PLASMA PROCESSING APPARATUS AND METHOD

FIELD OF THE INVENTION

The present invention relates to a plasma processing apparatus and a plasma processing method for performing a plasma process on a substrate.

BACKGROUND OF THE INVENTION

A semiconductor device manufacturing process includes a step for performing a plasma process such as an etching process, a film forming process or the like on a surface of a semiconductor wafer (hereinafter, referred to as a "wafer") as a substrate by using a plasma.

For example, an etching process is performed on multilayer films having different compositions, e.g., a bottom antireflection coating film, an amorphous carbon film, a silicon oxide film, an etching stop film and the like, which are laminated below a pattern mask in that order from the top on an silicon film of a pattern mask. Therefore, when a recess is formed in these multilayer films, an etching gas is changed for each film and, also, processing conditions such as a flow rate of the etching gas, a pressure and the like are controlled for each film. In order to uniformly etch each of the films, it is required to supply a processing gas such that the concentration thereof becomes uniform in a processing region above a wafer in accordance with the processing conditions for each film and to convert the processing gas into a plasma uniformly.

As for a method for performing a plasma process by using a plasma of a processing gas, there have been known, e.g., a CCP (capacitively coupled plasma) processing method, an ICP (inductively coupled plasma) processing method, a method using microwaves and the like.

The CCP processing method uses a parallel plate type plasma processing apparatus in which a processing gas supplied from a gas shower head formed of, e.g., a metal, and having at a bottom portion thereof a plurality of gas injection openings is converted into a plasma by applying a high frequency voltage between the gas shower head and a mounting table which mounts thereon a wafer in a processing chamber, the gas shower head being provided at a ceiling wall of the processing chamber so as to face the wafer. In this method, the processing gas is supplied from the shower head, so that the concentration distribution thereof in the processing region can be controlled even when the processing conditions such as the flow rate and the type of the processing gas are changed. Due to the uniform distribution of the concentration of the processing gas and the close installation of the mounting table and the gas shower head, the height of the processing chamber can be reduced. Moreover, the gas shower head is formed of an easily processable material, e.g., a metal, so that a cooling mechanism, e.g., a cooling water path, can be simply provided at the gas shower head. Accordingly, the temperature of the gas shower head can be easily controlled in accordance with the processing conditions.

However, in the CCP processing method, a path of a current flowing between the mounting table and the gas shower head is extremely complicated. Thus, it is difficult to uniformly convert the processing gas into the plasma, and the plasma density on the surface of the wafer is apt to be non-uniform. Accordingly, an etching rate in a diametrical direction of the wafer, for example, may be varied. Further, in this method, a high electron temperature of the plasma may inflict damages on the wafer. Moreover, a high frequency power supply needs to be connected to both or one of the mounting table and the gas shower head and, hence, the cost of the apparatus is increased.

The ICP processing method that has been conventionally used utilizes electromagnetic induction as described in, e.g., Japanese Patent Application Publication No. 2008-109155 (FIG. 1). Specifically, an ICP coil wound multiple times coaxially with respect to a wafer is provided at the ceiling wall of the processing chamber which is formed of a dielectric material, e.g., quartz. By applying a high frequency voltage to the coil, an electric field is generated in the processing chamber through the ceiling wall. The processing gas is turned into a plasma by the electric field thus generated. In this method, the electric field is generated below the coil, and the intensity of the electric field is changed in accordance with the value of the voltage applied to the coil. Accordingly, it is extremely easy to detect the plasma generation location and the concentration (amount) of the plasma. The plasma density distribution can be easily controlled by controlling the position of the coil or by dividing the coil into an inner and an outer coil respectively provided at an inner and an outer peripheral side of the wafer and controlling a voltage applied to each coil. Since the processing gas can be turned into a plasma simply by providing the coil at the ceiling wall of the processing chamber, the plasma process can be carried out cost-effectively.

However, when the coil is installed on the gas shower head formed of a metal which is provided at the ceiling wall of the processing chamber, the electric field is blocked by the gas shower head. Therefore, in order to form the uniform electric field in the processing region, the shower head formed of a metal cannot be used. However, a dielectric material, e.g., quartz, has poor workability compared to a metal, so that it is difficult to form the gas shower head by using the dielectric material in view of workability. For that reason, in case of employing such method, instead of providing the gas shower head, gas injection openings are formed at, e.g., a center portion of the ceiling wall and the sidewall of the processing chamber, and the processing gas is supplied through the gas injection openings. Hence, the uniformity of the distribution of the processing gas is decreased compared to the case of using the gas shower head. Moreover, since the concentration of the processing gas is non-uniform near the ceiling wall or the sidewall of the processing chamber, a large gap needs to be provided between the wafer (mounting table) and the ceiling wall or the sidewall of the processing chamber in order to improve the concentration distribution of the processing gas near the wafer. However, this results in scaling up of the processing chamber. Further, when the ceiling wall of the processing chamber is formed of a dielectric material, e.g., quartz, it is difficult to form a cooling water path at the ceiling wall in view of workability and, hence, it is difficult to control the temperature of the ceiling wall.

The above-described methods have advantages and disadvantageous, so that the use of only one of these methods is not enough to supply the processing gas such that the concentration distribution thereof becomes uniform in accordance with the various processing conditions and to convert the processing gas into a plasma uniformly. Thus, an etching rate, for example, may be varied in the wafer plane. In the method using microwaves as well as in the ICP processing method, it is difficult to control the flow rate of the processing gas or the temperature of the ceiling wall. In order to uniformly supply the processing gas and uniformly convert the processing gas into a plasma, there has been examined a technique for applying an ICP processing method to a CCP plasma processing apparatus by providing a dielectric member around the gas shower head formed at the ceiling wall of the processing chamber and winding a coil on the dielectric member coaxially with respect to the wafer. Besides, there has been examined a method for applying a DC voltage to a gas shower head in a CCP plasma processing apparatus, which is described in Japanese Patent Application Publication No. 2006-286813 (especially, FIG. 1). Although these methods can slightly improve the uniformity of the etching process, a method capable of performing uniform processing is still required.

As the opening diameter of the aforementioned pattern mask is reduced, the in-plane uniformity of the processing needs to be improved. Thus, as miniaturization of wiring structures progresses, more uniform plasma generation is required. When a large wafer having a diameter of, e.g., about 450 mm (18 inches), is used instead of a currently used wafer having a diameter of about 300 mm (12 inches), a large plasma suitable for the large wafer needs to be generated and, hence, a technique for ensuring more uniform plasma generation is required.

The method using microwaves has been known as one of the methods for performing a plasma process by using a plasma of a processing gas. In this method, a processing gas is converted into a plasma in a processing chamber by supplying microwaves from a microwave generating unit to an antenna installed at a ceiling wall of the processing chamber which is formed of a dielectric material, e.g., quartz. Accordingly, a plasma having a low electron temperature, for example, can be obtained.

In this method, since the ceiling wall of the processing chamber is formed of a dielectric material, the gas shower head having a plurality of gas supply holes for supplying the processing gas to the wafer cannot be installed at the ceiling wall of the processing chamber. It is difficult to form the gas shower head by using a dielectric material due to its low workability. Further, when the gas shower head formed of a metal that is easily processable is provided below the antenna, the microwaves are blocked by the gas shower head. To that end, in this apparatus, gas supply holes are formed, e.g., at the central portion of the ceiling wall of the processing chamber, and the processing gas is supplied through the gas supply holes into the processing chamber. However, this may lead to non-uniformity of the concentration distribution of the processing gas in the wafer plane. Specifically, the concentration of the processing gas tends to be high at the central portion of the processing region and low at the peripheral portion of the processing region. In order to reduce the gradient of the concentration of the processing gas near the wafer, a large gap needs to be formed between the ceiling wall of the processing chamber and the wafer. However, this results in scaling up of the processing chamber. Moreover, when the ceiling wall of the processing chamber is formed of a dielectric material, it is difficult to provide a coolant channel for circulating cooling water in the ceiling wall of the processing chamber and, accordingly, the temperature of the ceiling wall is not controllable.

Hence, in order to uniformly supply the processing gas and uniformly convert the processing gas into a plasma by microwaves, there has been examined a method in which a gas supply unit formed of a dielectric material, e.g., quartz, and having at a bottom surface thereof a plurality of gas supply holes is provided at a middle portion of the processing chamber (between the ceiling wall of the processing chamber and the wafer), which is described in, e.g., Japanese Patent Application Publication No. 2008-140998 (especially, FIG. 2 and paragraphs 0027 to 0029). Further, a plurality of openings is formed at the gas supply unit so that the upper portion (ceiling wall side) and the lower portion (wafer side) of the processing chamber can communicate with each other. A gas for plasma generation, e.g., Ar gas, is turned into a plasma by microwaves in the upper portion of the processing chamber, and the plasma thus generated is directed downward to be supplied toward the wafer through the openings of the gas supply unit. Accordingly, the processing gas is turned into a plasma even in the lower portion of the gas supply unit.

Such processing gas supply method enables uniform distribution of the processing gas compared to the method for supplying the processing gas from the central portion of the ceiling wall of the processing chamber. However, in this method, the openings are formed at the gas supply unit, so that the amount of the processing gas is small below the openings, and a plasma is non-uniformly generated. As a consequence, the arrangement pattern of the openings may be transferred to the wafer.

As the opening diameter of the pattern mask is reduced, the in-plane uniformity of the processing is required. Hence, as miniaturization of wiring structures progresses, a plasma needs to be generated more uniformly. When a large wafer having a diameter of, e.g., about 450 mm (18 inches) is used instead of a wafer having a diameter of, e.g., about 300 mm (12 inches), a technique for ensuring more uniform plasma generation is required in order to generate a large plasma suitable for the large wafer. In the large wafer, the uniformity of the plasma process may be deteriorated in the circumferential direction, so that a technique for improving the uniformity of the plasma distribution in the circumferential direction as well as the diametrical direction is required.

SUMMARY OF THE INVENTION

In view of the above, the present invention provides a plasma processing apparatus and a plasma processing method capable of performing a plasma process on a substrate with high in-plane uniformity.

In accordance with an aspect of the present invention, there is provided a plasma processing apparatus for processing a substrate by using a plasma, including: a processing chamber; a mounting table, provided in the processing chamber, for mounting thereon a substrate; a gas shower head formed of a conductive material provided to face the mounting table, the gas shower head having at a bottom surface thereof a plurality of gas injection openings for supplying a processing gas into the processing chamber; an induction coil to which a high frequency current is supplied to generate an inductively coupled plasma in a region surrounding a space below the gas shower head; a negative voltage supply unit for applying a negative DC voltage to the gas shower head to allow an electric field induced by the induction coil to be drawn to a central portion in a processing region; and a unit for evacuating the processing chamber.

With such configuration, when the plasma process is performed on the substrate, the processing gas is uniformly supplied to the substrate from the gas shower head formed of a conductive material and facing the mounting table mounting thereon the substrate, and the inductively coupled plasma is generated in the region surrounding the space below the gas shower head. Further, a thick DC sheath is formed below the gas shower head by applying a DC voltage to the gas shower head, and the plasma is diffused to the central portion via the DC sheath.

Accordingly, while using the inductively coupled plasma, the processing gas can be uniformly supplied from the gas shower head and the plasma can be generated uniformly along the surface of the substrate and also in the space below the gas shower head. As a result, the plasma process having high in-plane uniformity can be performed on the substrate.

Preferably, the induction coil is wound around an axis extending in a direction parallel with the substrate and perpendicular to a diametrical direction of the processing chamber.

Further, the induction coil is preferably provided in a plural number along a circumferential direction of the processing chamber.

Preferably, the induction coil is wound in an angular shape having a side parallel with the substrate.

Preferably, the induction coil is provided above the processing chamber, and a ceiling wall of the processing chamber around the gas shower head is formed of a dielectric material.

Preferably, the induction coil is buried in a dielectric material and forms a part of a ceiling wall of the processing chamber.

Preferably, at least a bottom surface portion of the gas shower head is formed of silicon.

Preferably, the plasma processing apparatus further includes: a storage unit storing, in corresponding relationship, recipes of processes to be performed on the substrate, values of the negative DC voltage, and values of the high frequency power supplied to the induction coil; and a control unit for outputting a control signal by reading out a value of the negative DC voltage and a value of the high frequency power in accordance with a specific recipe from the storing unit.

In accordance with another aspect of the present invention, there is provided a plasma processing method for processing a substrate by a plasma, including: mounting a substrate on a mounting table in a processing chamber; forming an electric field in a region surrounding a space below a gas shower head formed of a conductive material and disposed to face the mounting table by supplying a high frequency current to an induction coil positioned outwardly of the gas shower head in a diametrical direction of the processing chamber; supplying a processing gas into the processing chamber through gas injection openings formed at a bottom surface of the gas shower head to allow the processing gas to be converted into a plasma by the electric field; and applying a negative DC voltage to the gas shower head to allow the electric field induced by the induction coil to be drawn to the central portion of a processing region.

Preferably, the induction coil is wound around an axis extending in a direction parallel with the substrate and perpendicular to the diametrical direction of the processing chamber.

Preferably, the induction coil is provided in a plural number along the circumferential direction of the processing chamber.

Preferably, the induction coil is wound in an angular shape having a side parallel with the substrate.

Preferably, the plasma processing method further includes reading out a value of a negative DC voltage and a value of a high frequency power supplied to the induction coil in accordance with a specific recipe from a storage unit storing, in corresponding relationship, recipes of processes to be performed on the substrate, values of the negative DC voltage and values of the high frequency power supplied to the induction coil.

In accordance with still another aspect of the present invention, there is provided a storage medium that is used for a plasma processing apparatus for processing a substrate and stores therein a computer program operating on a computer, wherein the computer program has instructions for performing the plasma processing method described above.

In accordance with still another aspect of the present invention, there is provided a plasma processing apparatus for processing a substrate by a plasma, including: a mounting table, provided in a processing chamber, for mounting thereon a substrate; a gas shower head formed of a conductive material provided to face the mounting table, the gas shower head having at a bottom surface a plurality of gas injection openings for supplying a processing gas into the processing chamber; a microwave supply unit to which microwaves are supplied to convert a processing gas into a plasma in a region surrounding a space below the gas shower head; a negative voltage supply unit for applying a negative DC voltage to the gas shower head to allow an electric field induced by the induction coil to be drawn to a central portion of a processing region; and a unit for evacuating the processing chamber.

With such configuration, when the plasma process is performed on the substrate, the processing gas is uniformly supplied to the substrate from the gas shower head formed of a conductive material and facing the mounting table mounting thereon the substrate, and the plasma is generated in the region surrounding the space below the gas shower head by the microwaves. Further, a thick DC sheath is formed below the gas shower head by applying a DC voltage to the gas shower head, and the plasma is diffused to the central portion via the DC sheath.

Accordingly, while using the plasma generated by the microwaves, the processing gas can be uniformly supplied from the gas shower head and the plasma can be generated uniformly along the surface of the substrate and also in the space below the gas shower head. As a result, the plasma process having high in-plane uniformity can be performed on the substrate.

Since the plasma can be uniformly generated by the microwaves along the circumferential direction of the region surrounding the space below gas shower head, the plasma process having high in-plane uniformity can be carried out.

Preferably, the microwave supply unit is provided in a plural number along the circumferential direction of the processing chamber.

Preferably, a ceiling wall of the processing chamber around the gas shower head is formed of a dielectric material, and the microwave supply unit is provided above the ceiling wall.

Preferably, an opening is formed at a ceiling wall of the processing chamber, the opening being positioned below the microwave supply unit and around the gas shower head, and the microwave supply unit is airtightly provided at the processing chamber to block the opening.

Preferably, the plasma processing apparatus further includes: a storage unit storing, in corresponding relationship, recipes of processes to be performed on the substrate and values of the negative DC voltage; a control unit for outputting a control signal by reading out a value of the negative DC voltage in accordance with a specific recipe from the storing unit.

Alternatively, the plasma processing apparatus further includes: a storage unit storing, in corresponding relationship, recipes of processes to be performed on the substrate, values of the negative DC voltage, and values of the microwave power supplied to the microwave supply unit; and a control unit for outputting a control signal by reading out a value of the negative DC voltage and a value of the microwave power in accordance with a certain recipe from the storing unit.

In this case, preferably, the microwave supply unit is provided in a plural number along the circumferential direction of the processing chamber; the storage unit stores, in corresponding relationship, recipes and values of the microwave power supplied to each of the microwave supply units; and the control unit outputs a control signal by reading out a value of the microwave power supplied to each of the microwave supply units in accordance with the recipe.

BRIEF DESCRIPTION OF THE DRAWINGS

FIG. 5 is a schematic view of a control unit of the plasma processing apparatus shown in FIG. 1.

FIG. 6 is a schematic view showing a state of an electric field in the case of applying no DC voltage to the gas shower head.

FIG. 7 is a schematic view showing a state in which an etching gas is turned into a plasma in the plasma processing apparatus shown in FIG. 1.

FIG. 8 is a schematic view showing a state in which an etching gas is turned into a plasma in the plasma processing apparatus shown in FIG. 1.

FIG. 9 is a schematic view showing a state in which an etching gas is turned into a plasma in the plasma processing apparatus shown in FIG. 1.

FIG. 29 is a schematic view showing a state in which an etching gas is turned into a plasma in the plasma processing apparatus shown in FIG. 18.

FIG. 30 is a schematic view showing a state in which an etching gas is turned into a plasma in the plasma processing apparatus shown in FIG. 18.

DETAILED DESCRIPTION OF THE EMBODIMENT

Figure 1:
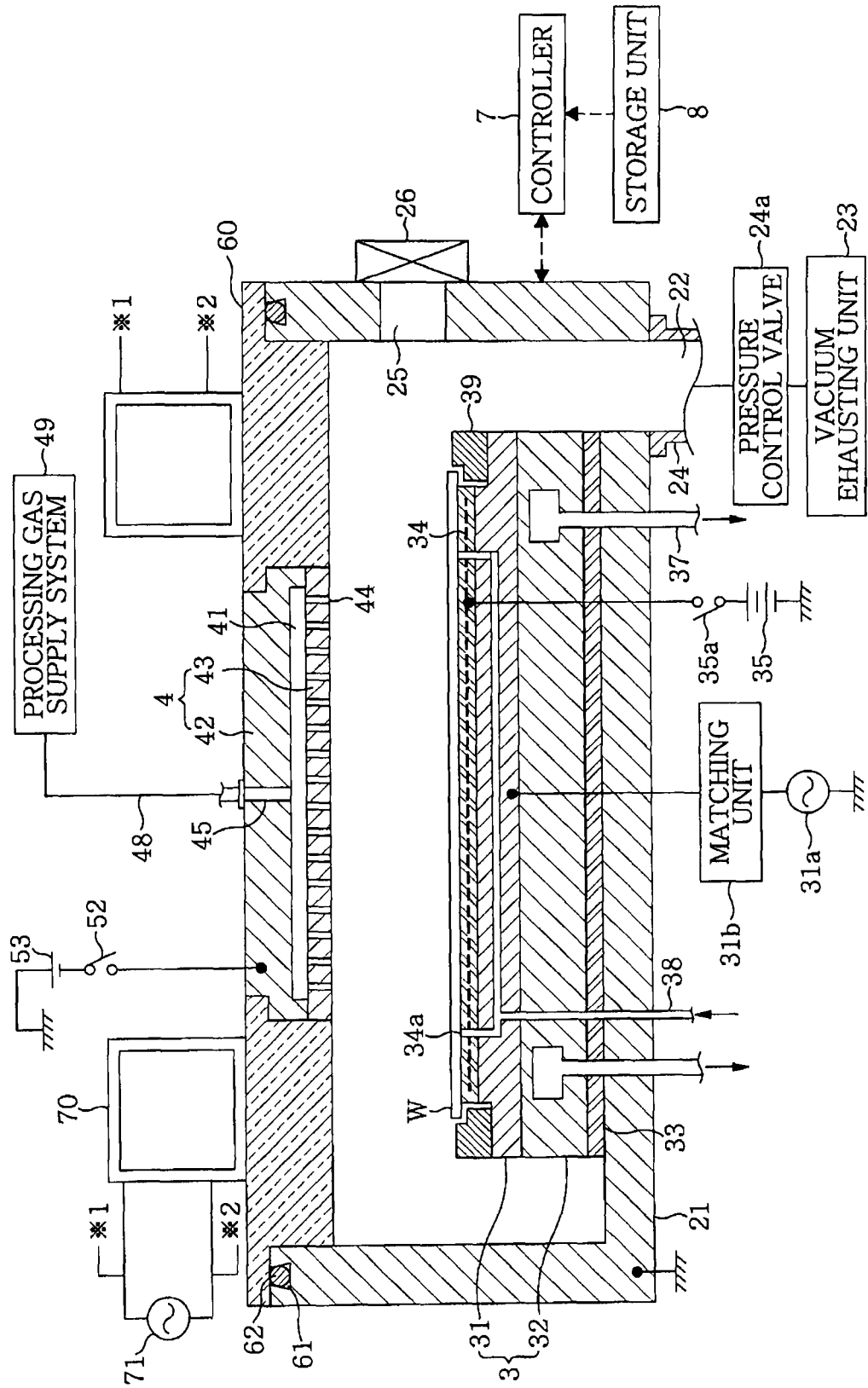
FIG. 1 is a vertical cross sectional view of a plasma processing apparatus in accordance with an embodiment of the present invention.

A plasma processing apparatus in accordance with a first embodiment of the present invention will be described with reference to FIGS. 1 to 5. This plasma processing apparatus performs a plasma process, e.g., an etching process, on a semiconductor wafer (hereinafter, referred to as a "wafer") as a substrate by a plasma of a processing gas. The following is brief description of the wafer W. The wafer W has a silicon base film and films laminated thereon. The laminated films include a photoresist mask formed of, e.g., an organic material, and having a predetermined pattern, a bottom anti-reflection coating film formed of, e.g., an organic film, an amorphous carbon film, an insulating film ($SiO_2$ film or SiCOH film) or a Poly-Si (polycrystalline silicon) film, an etching stop film formed of, e.g., an inorganic film, and the like, which are laminated in that order from the top. As will be described later, the plasma processing apparatus performs an etching process to form a recess in the films laminated on the base layer through the pattern of the photoresist mask.

The plasma processing apparatus includes a processing chamber 21 formed of a vacuum chamber, and a mounting table disposed at the center of the bottom surface of the processing chamber 21. The processing chamber 21 is electrically grounded. A gas exhaust port 22 is formed on the bottom surface of the processing chamber 21 at a side of the mounting table 3. A vacuum exhaust unit 23 including a vacuum pump or the like is connected to the gas exhaust port 22 via a gas exhaust line 24 having a pressure control valve 24a as a pressure control unit. The pressure control valve 24a and the vacuum exhaust unit 23 constitute a unit for exhausting the processing chamber 21 to a vacuum state. Formed at a sidewall of the processing chamber 21 is a transfer opening 25 for loading and unloading a wafer W. The transfer opening 25 can be closed and opened by a gate valve 26.

The mounting table 3 includes a lower electrode 31 and a supporting body 32 supporting the lower electrode 31 from the bottom. The mounting table 3 is disposed on the bottom surface of the processing chamber 21 via an insulation member 33. An electrostatic chuck 34 is provided on the mounting table 3, and the wafer W is electrostatically attracted and held on the mounting table 3 by applying a voltage from a high voltage DC power supply 35 to the electrostatic chuck 34.

Formed in the mounting table 3 is a temperature control medium path 37 through which a temperature control medium flows. The temperature of the wafer W is controlled by the temperature control medium. Further, a gas channel for supplying a thermally conductive gas as a backside gas to the backside of the wafer W is formed in the mounting table 3. The gas channel 38 opens at a plurality of locations on the top surface of the mounting table 3. A plurality of through holes 34a communicating with the gas channel 38 is formed in the electrostatic chuck 34. The backside gas is supplied to the backside of the wafer W through the through holes 34a.

A high frequency bias power supply 31a for supplying a high frequency power of about 0 W to 4000 having a frequency of, e.g., 13.56 MHz is connected to the lower electrode 31 via a matching unit 31b. As will be described later, ions in the plasma are attracted toward the wafer W by the high frequency bias power supplied from the high frequency bias power supply 31a.

Further, a focus ring 39 is disposed on the outer peripheral edge portion of the lower electrode 31 to surround the electrostatic chuck 34. The plasma is converged toward the wafer W on the mounting table 3 through the focus ring 39.

A gas shower head 4 forming an inner ceiling plate is disposed at the center of the ceiling wall of the processing chamber 21 so as to face the mounting table 3. The gas shower head 4 includes an electrode 42 formed of a conductive material, e.g., aluminum, and having a circular recess on a bottom surface thereof, and a supporting member forming a circular-plate shaped shower plate which is formed of a conductive material, e.g., polycrystalline silicon, and covers the bottom surface of the electrode 42. Although the conductive member in this example is a semiconductor, it may be a conductor, e.g., a metal. The space defined by the electrode 42 and the supporting member serves as a gas diffusion space 41 for diffusing the processing gas.

A DC power supply 53 serving as a negative voltage supply unit for applying a negative DC voltage of, e.g., about 0 V to −2000 V, is connected to the electrode 42 via a switch 52. Upon plasma generation, a sheath having a thickness determined by a value of a voltage applied by the DC power supply 53 is formed in the region below the gas shower head 4. Due to the formation of the sheath, the electric field formed (induced) at the peripheral portion of the processing region by an induction coil 70 to be described later can be drawn to the central portion of the processing region.

A processing gas supply line 45 communicating with a gas diffusion space 41 is formed in a central portion of the electrode 42. A processing gas supply system 49 is connected to an upstream side of the processing gas supply line 45 via a gas supply line 48. The processing gas supply system 49 supplies a processing gas to the wafer W. In this example, a gaseous mixture of an etching gas for performing an etching process, e.g., fluorocarbon gas, chlorine ($Cl_2$) gas, carbon monoxide (CO) gas, hydrogen bromide (HBr) gas, ozone ($O_3$) gas or the like, and a dilution gas such as Ar gas or the like is supplied as a processing gas into the processing chamber 21. Although it is not illustrated, the processing gas supply system 49 includes a plurality of branch lines provided with, e.g., valves or flow rate control units, and gas sources connected to the respective branch lines. Each of the gas sources stores therein the etching gas or the dilution gas. Hence, a specific etching gas and Ar gas can be supplied at a desired flow rate ratio in accordance with types of etching target films to be etched.

The supporting member 43 is airtightly pressed against the electrode 42 via, e.g., a sealing member (not shown) formed at the peripheral edge portion of the top surface thereof. Further, a plurality of gas injection openings 44 is formed at the supporting member 43 so that the gas can be supplied from the gas diffusion space 41 to the wafer W with high in-plane uniformity. In this example, in order to deal with a wafer W having a diameter of, e.g., about 12 inches, the outermost gas injection openings 44 formed in the gas shower head 4 are positioned at locations separated from the center of the processing chamber 21 by, e.g., about 12.0 cm. The outermost gas injection openings 44 may be positioned at locations separated from the center by about 15 cm (outer edge of the wafer W), or may be positioned closer to the center compared to the locations thereof in this example. The minimum size of the gas shower head 4 is set within a range which ensures high in-plane uniformity of the gas distribution in the wafer W.

A ring-shaped region surrounding the gas shower head 4 at the ceiling wall of the processing chamber 21 includes an outer ceiling plate 60 which is formed of a dielectric material, e.g., quartz. The outer ceiling plate 60 and the gas shower head 4 are airtightly coupled through a ring-shaped sealing member (not shown) formed at, e.g., an inner peripheral end of the outer ceiling plate 60, and are fixed such that the vertical positions of the lower end surfaces thereof are located at the same height. The outer ceiling plate 60 is supported at the outer peripheral end thereof by the sidewall of the processing chamber 21. Here, the vertical position of the outer peripheral end of the ceiling wall is higher than that of the inner peripheral end of the ceiling wall so that the ceiling wall (the gas shower head 4 and the outer ceiling plate 60) of the processing chamber 21 are positioned inside the processing chamber 21, which allows the gas shower head 4 and the mounting table 3 to be disposed close to each other. Moreover, a ring-shaped groove 61 is formed at the upper end portion of the sidewall of the processing chamber 21 along the circumferential direction. A sealing member 62, e.g., an O-ring or the like, is accommodated in the groove 61. When the inner atmosphere of the processing chamber 21 is exhausted to vacuum by the vacuum exhaust unit 23, the outer ceiling plate 60 is drawn against the processing chamber 21, and airtightness of the processing chamber 21 is maintained by the sealing member 62.

Figure 2:
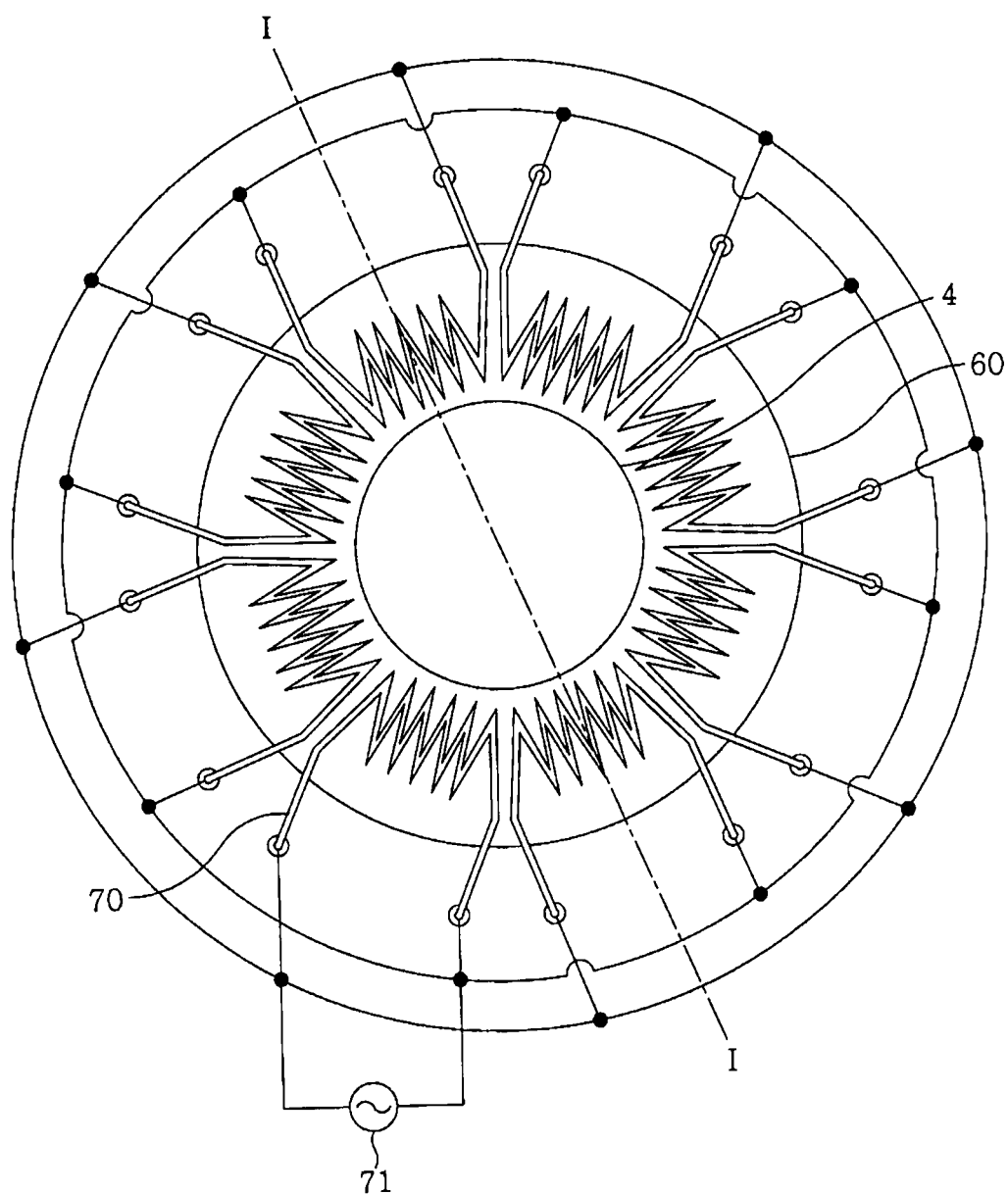
FIG. 2 is a top view of a gas shower head of the plasma processing apparatus shown in FIG. 1.
Figure 3:
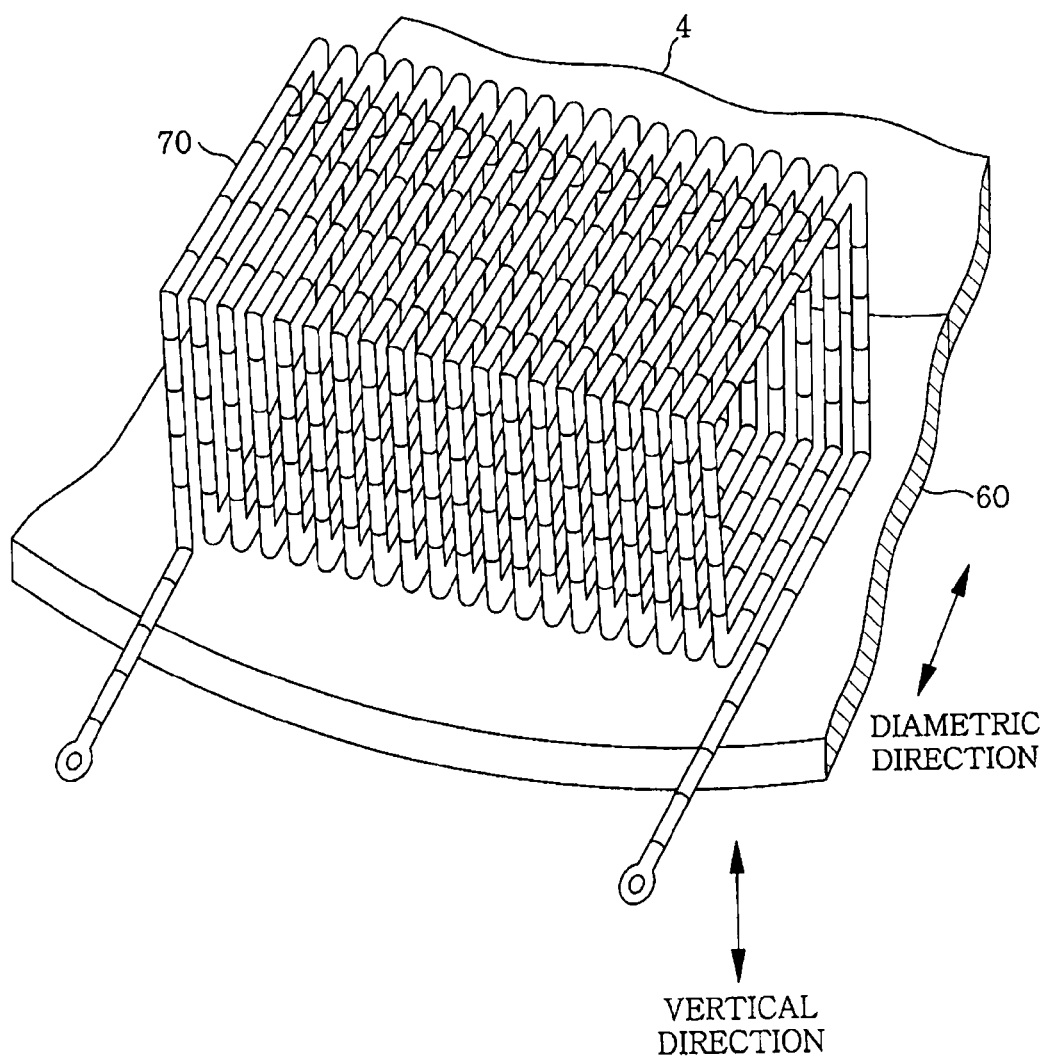
FIG. 3 is a perspective view of a coil on the gas shower head shown in FIG. 2 which is obtained by cutting the gas shower head.

As shown in FIG. 2, the induction coil 70 as an induction conductor around which a conductive line formed of, e.g., a metal, is wound multiple times in an angular shape is provided at a plurality of, e.g., eight, locations spaced apart from each other at regular intervals along the circumferential direction of the outer ceiling plate 60. More specifically, each of the induction coils 70 is formed by winding a conductive line around portions corresponding to sides of a polygon (triangle or more), an octagon in this example, in the horizontal plane of the processing chamber 21. An inductively coupled plasma is generated by electromagnetic induction in the region below the induction coils 70 in the processing chamber 21, i.e., the region surrounding the space below the gas shower head, via the outer ceiling plate 60. The induction coils 70 are connected in parallel with a high frequency power supply 71 for supplying a high frequency power of about 500 W to 3000 having a frequency of, e.g., 13.56 MHz. By supplying a high frequency current to the induction coils 70, an electric field Er induced in the winding direction of the induction coils 70 and an electric field Ez induced in a (vertical) direction perpendicular to the central axes of the induction coils 70 are generated. Here, the induction coils 70 are arranged such that the electric field Er is directed from the peripheral portion of the processing chamber 21 to the central portion thereof and vise versa (along the diametrical direction of the processing chamber 21). For convenience, FIG. 3 shows an enlarged view of one of the induction coils 70. Although the illustration is simplified in FIGS. 2 and 3, the induction coils 70 are formed of multi-wound conductive lines. FIG. 1 is a vertical cross sectional view of the processing chamber 21 which is taken along line I-I in FIG. 2.

Figure 4A:
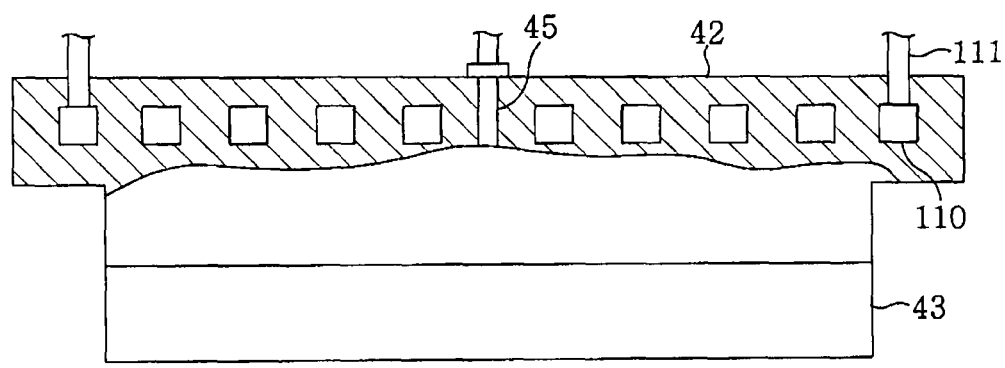
FIGS. 4A and 4B are explanatory views showing the gas shower head shown in FIG. 2.
Figure 4B:
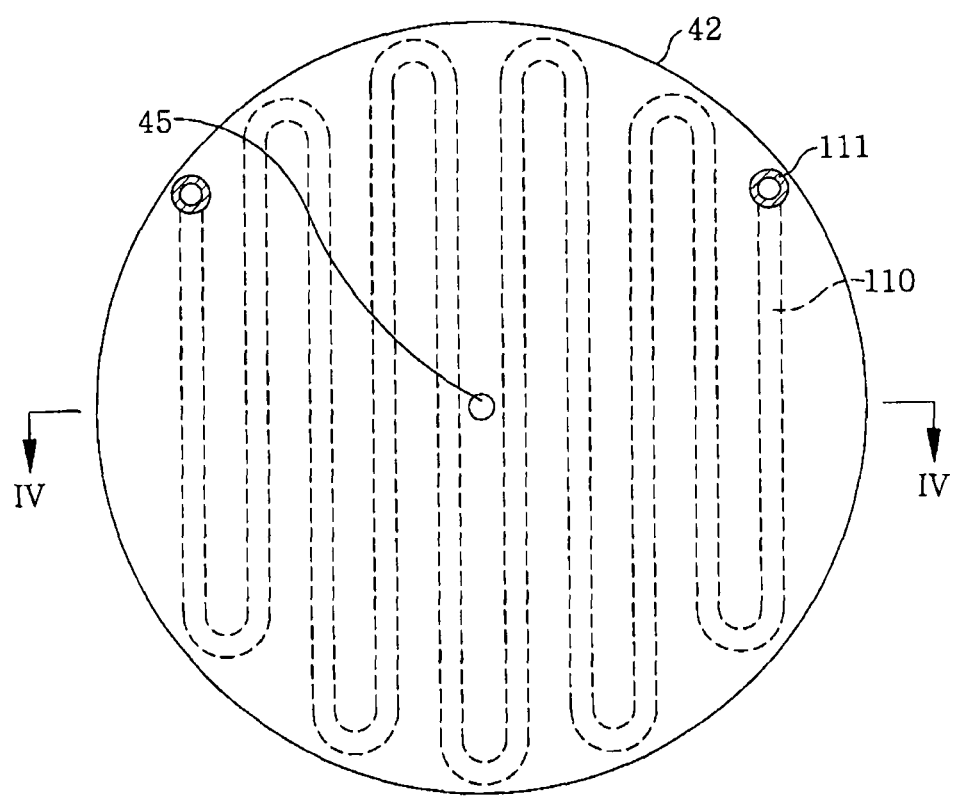

Although it is not shown in FIG. 1, the gas shower head 4 has a cooling unit. Specifically, as shown in FIGS. 4A and 4B, the cooling unit includes a temperature control medium path 110 that is horizontally formed in a serpentine shape so as not to interfere with the processing gas supply line 45 in the electrode 42. The temperature of the gas shower head 4 can be controlled by circulating a temperature control medium, e.g., water, having a temperature controlled to a predetermined level in the temperature control medium path 110 via a temperature control fluid port 111. FIG. 4A is a vertical cross sectional view of the gas shower head 4 which are taken along line IV-IV in FIG. 4B.

As shown in FIG. 5, a control unit 7 is connected to the plasma processing apparatus. The control unit 7 includes a CPU 11, a work memory 13, and a memory 14 as a data storage. The memory 14 is provided with areas for storing processing conditions for each recipe, such as a type of a film to be etched (etching target film), a type of an etching gas, a gas flow rate, a processing pressure, a value of a high frequency power supplied to the induction coils 70, a value of a negative DC voltage applied from the DC power supply 53 and the like.

As described above, different types of multilayer films are laminated on the wafer W. Hence, when an etching process is performed on these multilayer films, an etching gas needs to be changed for each film and, also, the flow rate of the etching gas, the processing pressure and the like need to be changed for each film. In order to perform a uniform etching process over the surface of the wafer W, the etching gas needs to be converted into a plasma uniformly over the surface of each film. Especially, a plasma needs to be generated uniformly in the diametrical direction of the wafer W. In the present embodiment, in order to improve the in-plane uniformity of the amount (concentration) of the plasma generated by the electric field, the intensity of the electric field generated at the peripheral portion of the processing region by the induction coils 70 and the intensity of the electric field induced to the central portion of the processing chamber by the negative DC voltage are controlled, on a film basis, by controlling the value of the negative voltage applied to the gas shower head 4. To do so, a value of a voltage to be applied to the gas shower head 4 is obtained in advance on a film (recipe) basis by performing tests or calculations, and the obtained value is stored in the memory 14 on a recipe basis. Without obtaining the value of the voltage in advance on a recipe basis, the corresponding value may be obtained whenever the process is performed.

The program 12 has an instruction for the CPU 11 to read out a recipe corresponding to a film to be etched from the memory 14 to the work memory 13 and send a control signal to each unit of the plasma processing apparatus in accordance with the recipe to thereby execute steps to be described later and perform an etching process. Generally, this program (including a program for inputting and displaying processing parameters) 12 is stored in the storage unit 8, e.g., a hard disk, a compact disk, a magneto-optical disk, a memory card or the like, and installed from the storage unit 8 to the control unit 7 (the program storage unit 12 thereof).

Hereinafter, the operation of the plasma processing apparatus will be described with reference to FIGS. 6 to 10. First, a recipe for an etching target film formed on the surface of the wafer W is read out from the memory 14 to the work memory 13. In this example, the etching target film is, e.g., a bottom anti-reflection coating film, so that the recipe for this film is read out. Next, the wafer W is loaded from a vacuum transfer chamber (not shown) maintained at a vacuum atmosphere into the processing chamber 21 by a substrate transfer unit (not shown) and mounted on the mounting table 3. Thereafter, the gate valve 26 is closed, and the inside of the processing chamber 21 is fully evacuated by the vacuum exhaust unit 23 by fully opening the pressure control valve 24a, for example. At the same time, the temperature control medium having a temperature controlled to a predetermined level and the backside gas are supplied from the temperature control medium channel 37 and the gas channel 38, thereby controlling the temperature of the wafer W to a predetermined level. By circulating in the temperature control medium path 110 the temperature control medium having a temperature controlled to a predetermined level through the temperature control fluid port 111, the temperature of the gas shower head 4 is controlled to a predetermined level.

Next, a high frequency power having a frequency of, e.g., 13.56 MHz, is supplied to the induction coils 70 at a power level of about 2000 W and, also, a high frequency bias power is supplied from the high frequency power supply 31a to the mounting table 3. By supplying the high frequency power to the induction coils 70, an electric field of a TM mode is generated in the region surrounding the space below the gas shower head 4 through the outer ceiling plate 60. This electric field includes a vertical electric field Ez and a horizontal electric field Er (directed from the peripheral portion of the processing region to the central portion of the gas shower head 4 and vise versa) along the diametrical direction of the wafer W. A negative DC voltage having a predetermined level, e.g., about −500 V, is applied to the gas shower head 4. Due to the application of the negative DC voltage, a negative electric field is generated near the bottom surface of the gas shower head 4.

Then, Ar gas is supplied together with the etching gas from the processing gas supply system 49 into the processing chamber 21, thereby controlling the pressure in the processing chamber 21 to a predetermined level, e.g., about 2.67 Pa (20 mTorr). Ar gas is activated at a low energy level and thus is preferably supplied into the processing chamber 21 together with the etching gas. The processing gas as a gaseous mixture of the etching gas and Ar gas is diffused into the processing chamber 21 and turned into a plasma below the induction coils 70 by the TM mode electric field. Accordingly, an inductively coupled plasma including $Ar^+$ ions or ions and electrons of the etching gas material is generated. The plasma generated at the peripheral portion of the processing region is diffused to the central portion of the gas shower head 4 in the processing chamber 21. The gas at the central portion is turned into a plasma by the plasma diffused to the central portion. Hence, a plasma 80 is generated horizontally over the entire processing region. If a negative DC voltage is not applied to the gas shower head 4, a plasma is generated mainly in the region below the induction coils 70, and the plasma density at the central portion becomes lower than that at the peripheral portion, as can be seen from FIG. 6. In FIG. 6, the region where the plasma density is high is indicated by oblique lines.

However, in the present embodiment, the negative DC voltage is applied to the gas shower head 4, so that a negative electric field is generated in a region near the bottom surface of the gas shower head 4, and a thick DC sheath 75 is formed immediately therebelow. The DC sheath 75 has a thickness determined by the value of the negative DC voltage. Further, the electric field Er is directed toward the central portion of the gas shower head 4 and passes through the DC sheath 75. Accordingly, a plasma is uniformly generated over the surface of the wafer W. The reason thereof is considered as follows. As shown in FIG. 7, the plasma generated below the induction coils 70 is drawn within the DC sheath 75 by the electric field Er, and the processing gas is turned into a plasma at the central portion by the electric field Er and the plasma drawn to the central portion. Therefore, the plasma density is increased at the boundary between the DC sheath 75 and the plasma region or a region close thereto. Hence, as shown in FIG. 8, the high-density plasma is generated below the DC sheath 75 as well as below the induction coils 70.

When the electrons in the plasma 80 collide with the etching gas or Ar gas, the corresponding gas is turned into a plasma. Then, electrons generated from this plasma collide with the etching gas or Ar gas, so that the sequential generation of plasma is continued to increase the density of the plasma 80. The high-density inductively coupled plasma generated by the induction coils 70 is diffused to the region below the gas shower head 4 via the DC sheath 75 and directed downward toward the wafer W by a downward exhaust flow. As a consequence, a highly uniform plasma 80 is generated over the surface of the wafer W.

As shown in FIG. 9, positive ions in the plasma, e.g., $Ar^+$ ions, are strongly attracted by the negative electric field of the DC sheath 75 and thus collide with the gas shower head 4. As a result of the collision, secondary electrons are generated from the gas shower head 4 and accelerated in the DC sheath 75. The accelerated secondary electrons are directed downward, and the processing gas is turned into a plasma by these secondary electrons. Therefore, the density of the plasma 80 above the wafer W is increased, and the in-plane uniformity of the plasma density is further improved.

Figure 10:
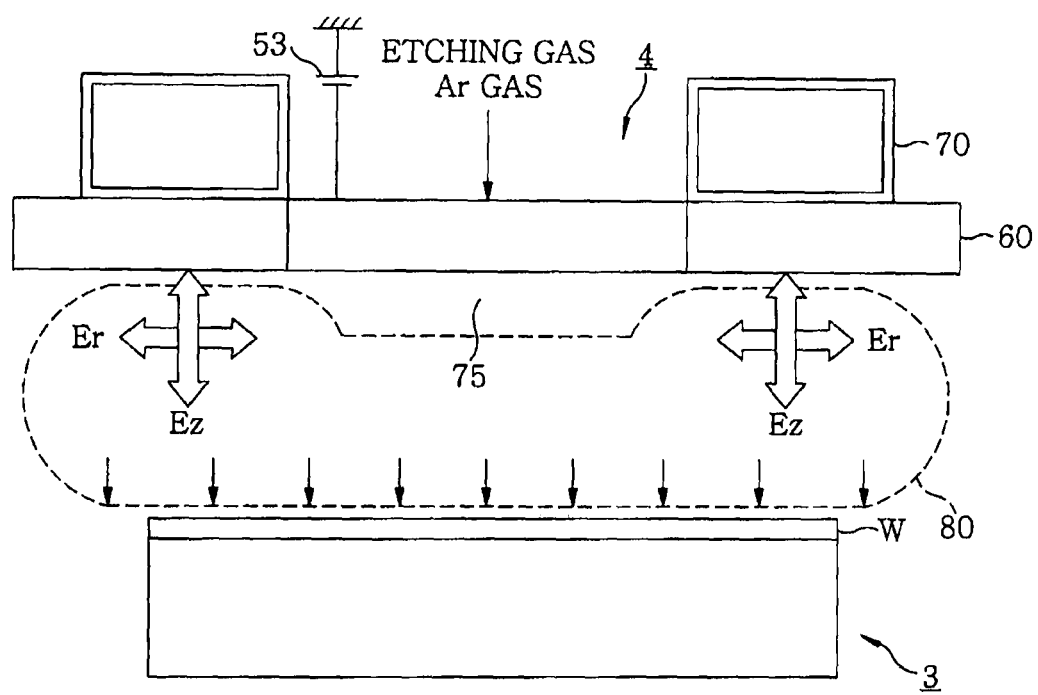
FIG. 10 is a schematic view showing a state in which an etching gas is turned into a plasma in the plasma processing apparatus shown in FIG. 1.

As shown in FIG. 10, ions in the plasma are attracted toward the wafer W by the high frequency bias power from the high frequency power supply 31a, so that a vertical etching process is carried out. The bottom anti-reflection coating film is etched until the amorphous carbon film formed under the bottom anti-reflection film is exposed.

Thereafter, the supply of the etching gas and Ar gas is stopped and, also, the supply of the high frequency power to the induction coils 70 and the application of the negative DC voltage to the shower head 4 are stopped. Next, the processing chamber 21 is exhausted to vacuum, and a recipe for an amorphous carbon film to be etched is read out from the memory 14 to etch the amorphous carbon film. Then, in the same manner, a recipe for a film formed under the amorphous carbon film is read out to perform an etching process on the film formed thereunder.

In accordance with the aforementioned embodiment, the gas shower head 4 having a conductive member is provided at the central portion of the ceiling wall of the processing chamber 21, so that the gas can be supplied uniformly over the surface of the wafer W. Further, an inductively coupled plasma is generated by the induction coils 70 in the region surrounding the space below the gas shower head 4, and the DC sheath 75 is formed below the gas shower head 4 by applying a negative DC voltage to the gas shower head 4. The plasma is diffused to the central portion via the DC sheath 75. Accordingly, while using the inductively coupled plasma, the gas can be uniformly supplied from the gas shower head 4 and the plasma 80 can be generated uniformly along the surface of the wafer W and also in the space below the gas shower head 4. As a result, the plasma process having high in-plane uniformity, e.g., the etching process in this example, can be performed on the wafer W.

Further, the plasma 80 having high in-plane uniformity in accordance with the processing recipe can be easily obtained by controlling the thickness of the DC sheath 75 by adjusting the negative DC voltage applied to the gas shower head 4. In this plasma processing apparatus, the inductively coupled plasma 80 can be generated simply by providing the induction coils 70 above the ceiling plate (outer ceiling plate 60) of the processing chamber 21. Thus, the plasma processing apparatus of the present embodiment has a simple configuration and can be achieved cost effectively. Although a conventional inductively coupled plasma processing apparatus is disadvantageous in that it is difficult to supply a gas to a substrate having a large area, the plasma processing apparatus of the present embodiment does not have such disadvantage.

In the above-described apparatus, the gas shower head 4 may be physically eroded through a so-called sputtering by impact of $Ar^+$ ions. Since, however, the bottom surface of the gas shower head 4 is formed of silicon, there is no fear of contamination. Besides, the etching gas is uniformly supplied from the gas shower head 4, so that the gas shower head 4 and the mounting table 3 can be disposed adjacent to each other and the height of the processing chamber 21 can be reduced. Further, the temperature of the gas shower head 4 can be controlled on a recipe basis by forming the temperature control medium path 110 substantially throughout the supporting member 43.

In the above example, the in-plane uniformity of the plasma density is improved by controlling the value of the negative DC voltage applied to the gas shower head 4. However, the uniformity of the plasma density may also be controlled by controlling the vale of the high frequency power supplied to the induction coils 70 as well as the value of the negative DC voltage or by controlling the value of the high frequency power supplied to the induction coil 70 while maintaining the negative DC voltage at a predetermined value.

In the above-described embodiment, the induction coils 70 are wound in an angular shape and, thus, a large electric field Er directed from the peripheral portion to the central portion of the processing chamber 21 and vise versa can be obtained. The induction coils 70 may be wound in a circular shape or in an elliptical shape of which a long axis is extended from the peripheral portion to the central portion of the processing chamber 21. Moreover, in order to generate an electric field in the processing chamber 21, a plurality of rod-shaped antennas may be radially arranged from the central portion to the peripheral portion of the processing chamber 21 instead of using the induction coils 70.

Figure 11:
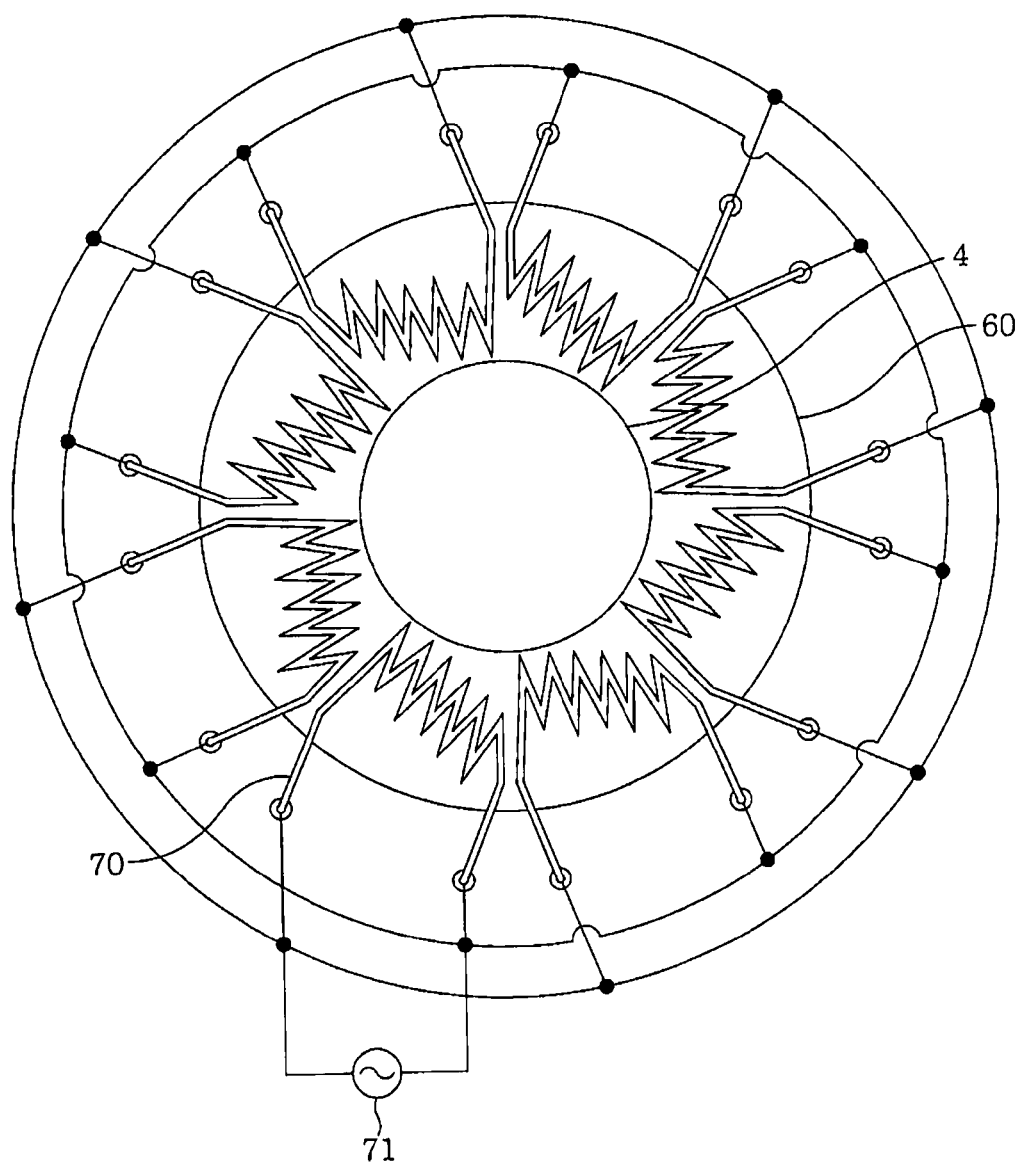
FIG. 11 is a top view of a gas shower head which shows another example of the coil.

Furthermore, in the above-described embodiment, the induction coils 70 are wound around the sides of the octagon of which center corresponds to the center of the processing chamber 21 when viewed from above such that the electric field Er generated in the processing chamber 21 among the electric fields Er induced by the induction coils 70 is directed toward the center of the processing chamber 21. However, as shown in FIG. 11, the induction coils 70 may be wound around axes slanted with respect to the respective sides in the horizontal plane. In that case, the electric field Er has components directed from the peripheral portion to the central portion of the processing chamber 21, and these electric field components are positioned within the DC sheath 75. Further, a control unit for controlling an impedance may be provided for each of the induction coils 70 to control a high frequency supplied to each of the induction coil 70. The induction coils 70 may be connected in series instead of being connected in parallel. Or, a high frequency power supply may be provided for each of the induction coils 70 to control a value of a high frequency current supplied to each of the induction coils 70.

Figure 12:
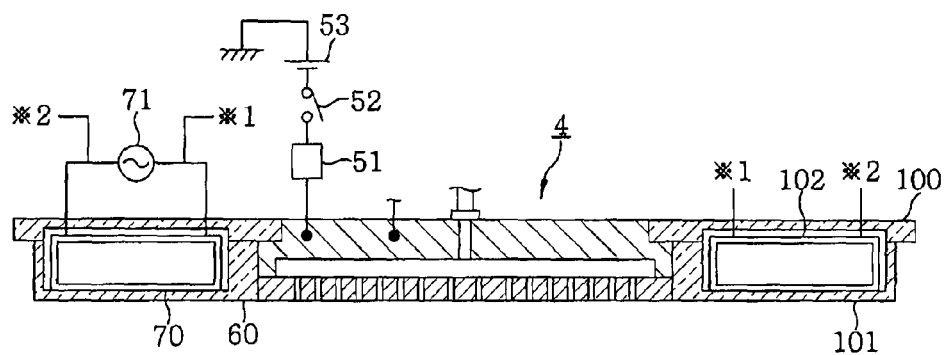
FIG. 12 is a vertical cross sectional view of a gas shower head which shows still another example of the coil.
Figure 13:
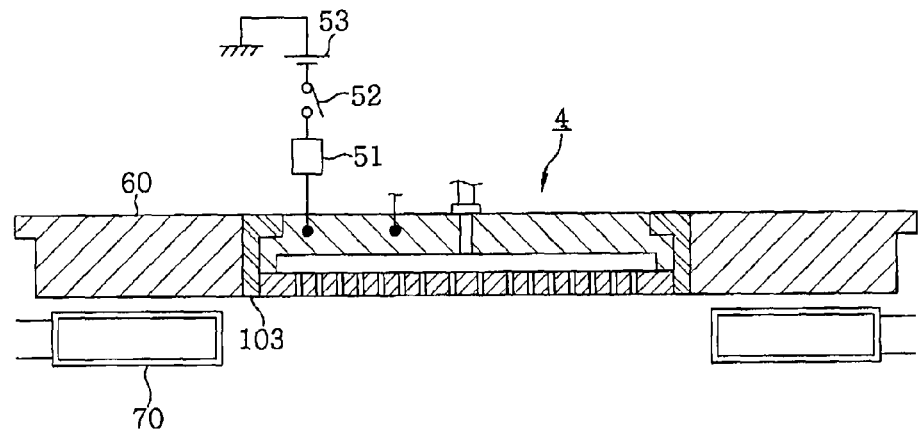
FIG. 13 is a vertical cross sectional view of a gas shower head which shows still another example of the coil.

In the above-described embodiment, the induction coils 70 are installed above the outer ceiling plate 60. However, as shown in FIG. 12, the outer ceiling plate 60 may be configured as a divided structure including an upper portion 100 and a lower portion 101, and the induction coils 70 may be accommodated in, e.g., a plurality of recesses 102 formed at the lower portion 101 while being spaced from each other at regular intervals along the circumferential direction. In that case, the effects of the above-described example are obtained. In other words, the etching gas is uniformly converted into a plasma, and the in-plane uniformity of the etching process is achieved. Instead of accommodating the induction coils 70 in the outer ceiling plate 60, the induction coils 70 may be installed below the outer ceiling plate 60 in the processing chamber 21. In this case, it is preferable to install an insulation member 103 between the outer ceiling plate 60 formed of, e.g., a conductive material, and the gas shower head 4, as shown in FIG. 13.

Figure 14:
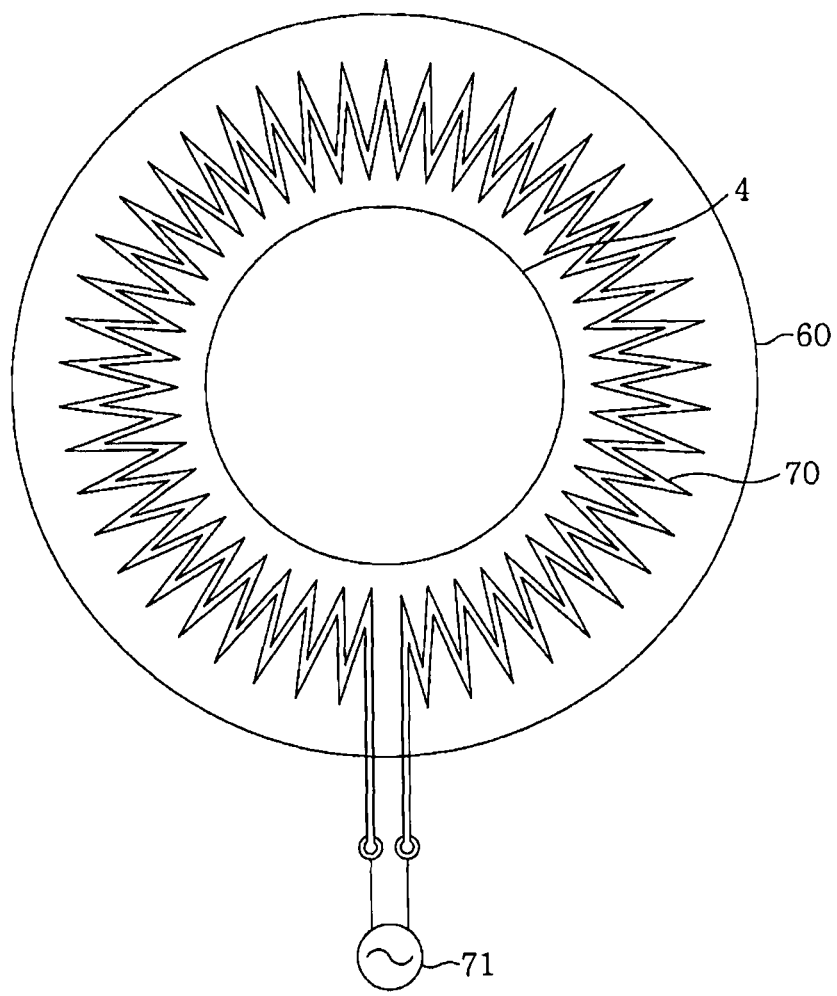
FIG. 14 is a top view of the gas shower head which shows still another example of the coil.

In the above-described example, the induction coils 70 are installed at a plurality of locations along the circumferential direction. However, as shown in FIG. 14, the induction coils 70 may be connected as a single induction coil provided along the circumferential direction. In this case, an electric field Er directed from the peripheral portion to the central portion is generated in the processing chamber 21. Therefore, the electric field Er penetrates the DC sheath 75 formed below the gas shower head 4, and the effects of the above-described embodiment can be obtained.

In order to form an electric field in the processing chamber 21, a star-connected or a delta-connected three-phase coil other than a single-phase coil may be provided along the circumferential direction of the processing chamber 21. Further, the technical scope of the present invention includes the case where the shower plate of the gas shower head 4 in the processing region is formed of a conductive material and a negative voltage is applied to the shower plate connected to the DC power supply 53 via the conductive path.

Although the etching process is described as an example of the plasma process in the above-described examples, the plasma processing apparatus of the present invention may be applied to, e.g., an etching apparatus or a film forming apparatus employing a CVD (Chemical Vapor Deposition) method using a plasma. For example, in the film forming apparatus, a value of a negative DC voltage applied to the gas shower head 4 is controlled in accordance with processing conditions such as a type or a flow rate of a film forming gas, a pressure and the like. Hence, the film forming process can be performed at a uniform film forming rate across the surface.

(Test)

The following is description of a test performed by using a CCP apparatus to monitor an electron density change caused by applying a negative DC voltage from the negative DC power supply 53 to the gas shower head 4.

The difference in the electron density below the gas shower head 4 between the case of applying a negative DC voltage (900 V) to the gas shower head 4 and the case of applying no negative DC voltage thereto was compared by using an electron density measuring probe.

(Result)

Figure 15:
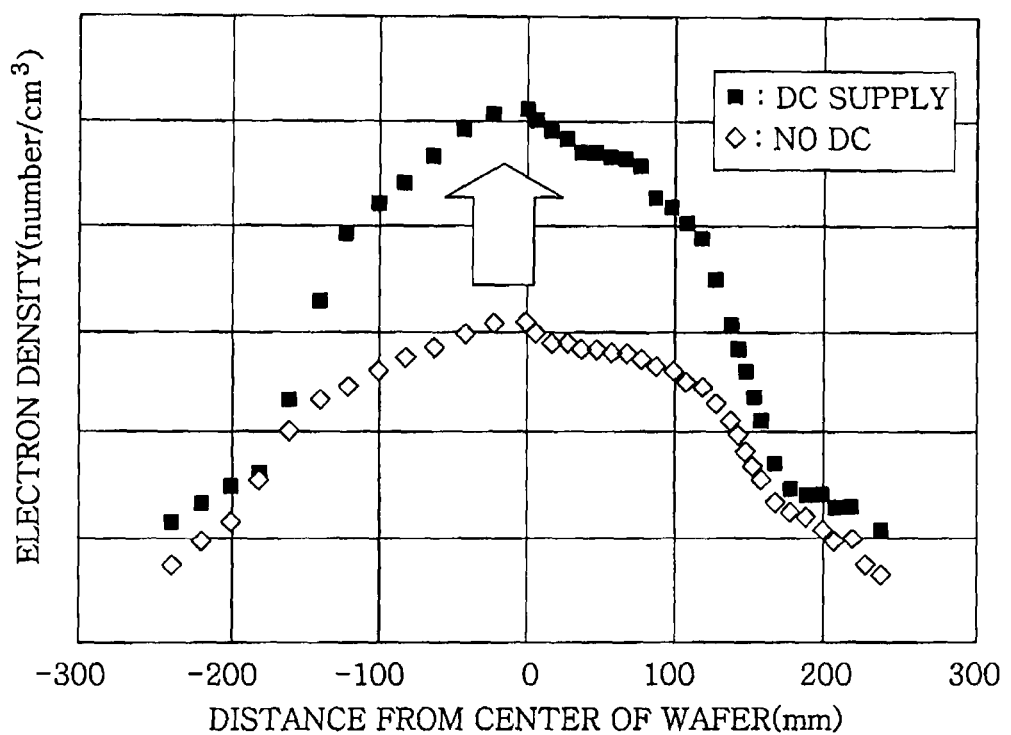
FIG. 15 is a characteristic view of the embodiment of the present invention.

FIG. 15 showed that the electron density below the gas shower head 4 was increased by applying a negative DC voltage to the gas shower head 4. In other words, positive ions between the gas shower head 4 and the mounting table 3 were attracted toward the gas shower head 4 by the DC sheath, and positive ions ($Ar^+$) in the plasma collided with the gas shower head 4, which results in generation of electrons.

Although it was not illustrated, another test or calculation showed that the electron density was increased by applying a negative DC voltage of about 200 V or more to the gas shower head 4.

(Simulation)

Next, simulation (calculation) using COMSOL as an electromagnetic field calculation software was performed to monitor the change in the density distribution of the TM mode electric field generated in the processing chamber 21 by winding the induction coils 70 as shown in FIG. 3 and applying a negative DC voltage to the gas shower head 4.

The calculation was performed in the case where a high frequency power having a high frequency of 13.56 MHz was supplied to the induction coils 70 at a power level of about 1500 W. Further, the calculation was performed in the cases where the DC sheaths 75 having different thicknesses of about 1 mm, 5 mm and 10 mm were generated below the gas shower head 4 by applying a negative DC voltage to the gas shower head 4. Further, the intensity of the electric field absorbed by the processing gas was monitored in the right half space of the processing chamber 21. The electron density of the plasma below the DC sheath 75 can be evaluated by the absorbed electric field intensity (the intensity of the electric field absorbed by the processing gas).

(Result)

Figure 16:
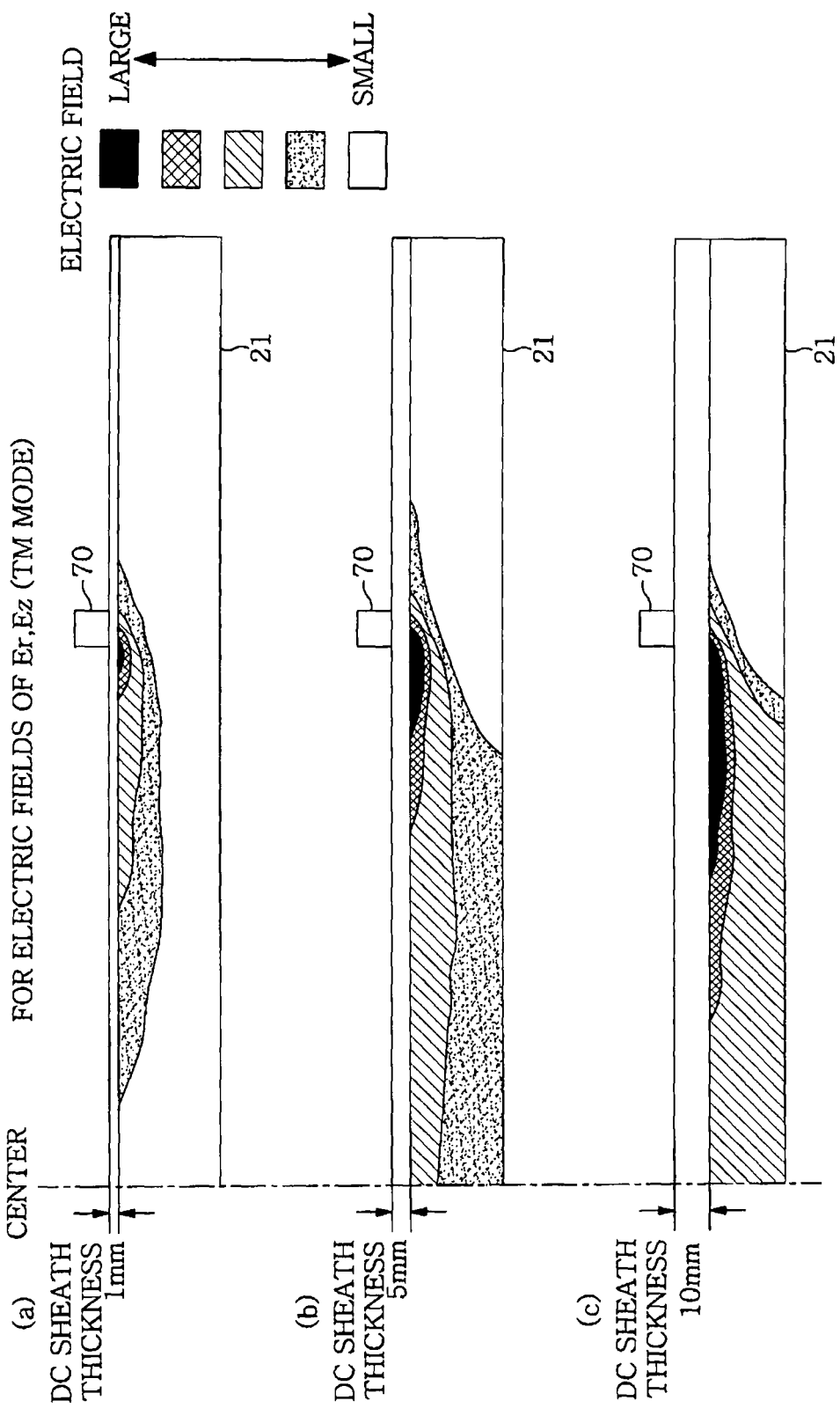
FIG. 16 is a characteristic view of the embodiment of the present invention.

As shown in (a) of FIG. 16, even when the thickness of the DC sheath was about 1 mm, in the region below the DC sheath 75, the region of the absorbed electric field intensity was extended to the area close to the central portion of the processing chamber 21. From the above, it was found that the TM mode electric field was extended toward the central portion of the wafer W. Further, (b) and (c) of FIG. 16 showed that the TM mode electric field generated below the induction coils 70 was further extended to the central portion of the wafer W by increasing the thickness of the DC sheath, i.e., by increasing the negative DC voltage applied to the gas shower head 4.

(Comparative Simulation)

Thereafter, the simulation calculation was performed in the case where the coil was wound coaxially with respect to the wafer W so as to generate the electric field (electric field in θ direction: TE mode) coaxially with respect to the peripheral edge portion of the wafer W as in the apparatus described in Japanese Patent Application Publication No. 2008-109155.

(Result)

Figure 17:
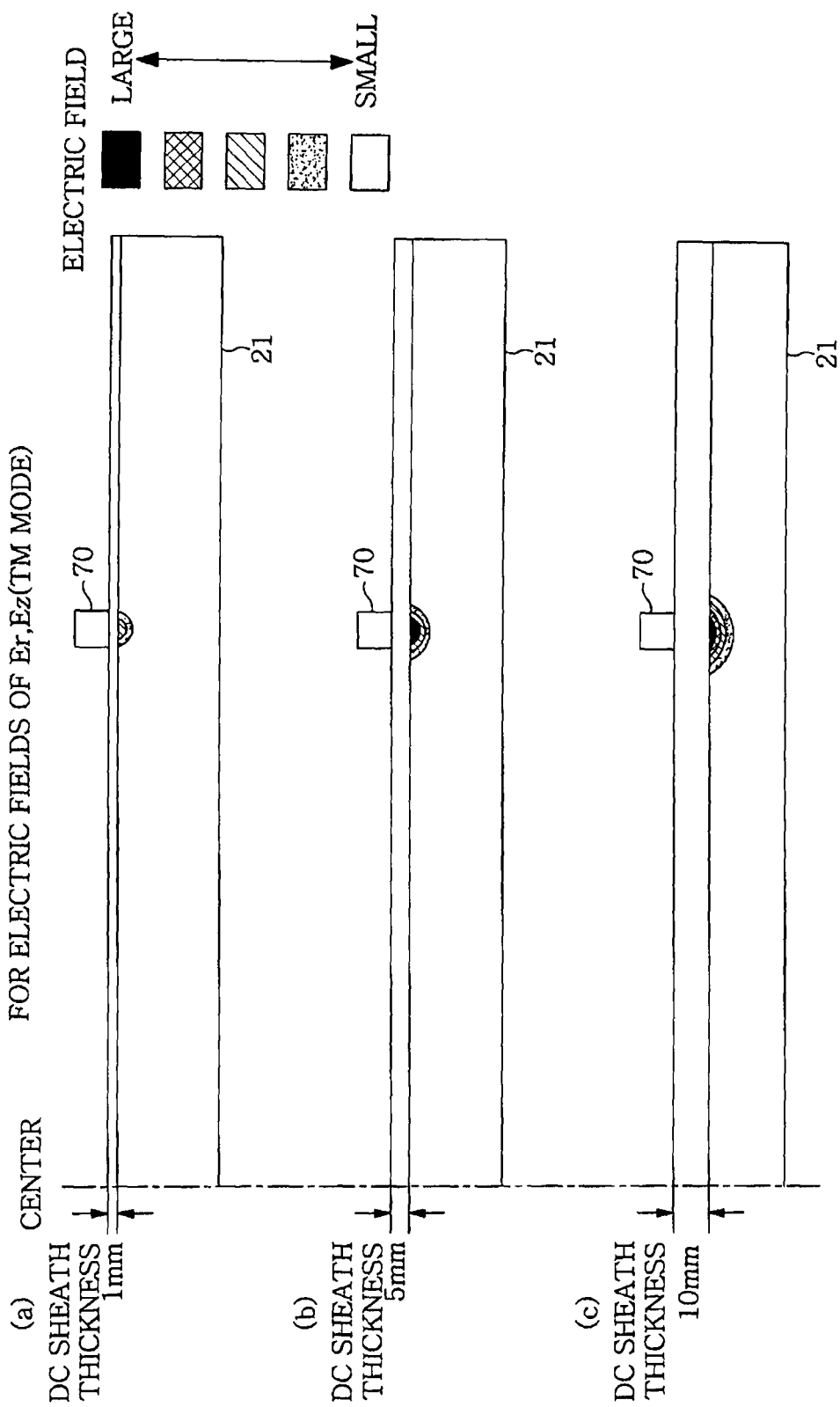
FIG. 17 is a characteristic view of the embodiment of the present invention.

As a result, as shown in FIG. 17, the region where the absorbed electric field intensity was high was positioned below the coil, and the electric field was not extended to the central portion of the wafer W. Such tendency was not changed even when the thickness of the DC sheath was increased. From this, it was found that the formation of the TM mode electric field was required to extend the electric field generated by the coil to the central portion of the wafer W.

Hence, as described above, in the present embodiment, the induction coils 70 need to be wound to have a portion substantially parallel with the diametrical direction of the wafer W and a portion substantially parallel with the vertical direction to thereby generate the electric field Er and the electrical field Ez.

Hereinafter, another embodiment in which the plasma processing apparatus of the present invention is applied to a plasma etching apparatus will be described with reference to FIGS. 18 to 26.

The plasma processing apparatus includes a processing chamber 1021 formed of a vacuum chamber, and a mounting table 1003 disposed at the center of the bottom surface of the processing chamber 1021. The processing chamber 1021 is electrically grounded. A gas exhaust port 1022 is formed on the bottom surface of the processing chamber 1021 at a side of the mounting table 1003. A vacuum exhaust unit 1023 including a vacuum pump or the like is connected to the gas exhaust port 1022 via a gas exhaust line 1024 having a pressure control valve 1024a as a pressure control unit. The pressure control valve 1024a and the vacuum exhaust unit 1023 constitute a unit for exhausting the processing chamber 1021 to a vacuum state. Formed at a sidewall of the processing chamber 1021 is a transfer opening 1025 for loading and unloading a wafer W. The transfer opening 1025 can be closed and opened by a gate valve 1026.

The mounting table 1003 includes a lower electrode 1031 and a supporting body 1032 supporting the lower electrode 1031 from the bottom. The mounting table 1003 is disposed on the bottom surface of the processing chamber 1021 via an insulation member 1033. An electrostatic chuck 1034 is provided on the mounting table 1003, and the wafer W is electrostatically attracted and held on the mounting table 1003 by applying a voltage from a high voltage DC power supply 1035 to the electrostatic chuck 1034.

Formed in the mounting table 1003 is a temperature control medium path 1037 through which a temperature control medium flows. The temperature of the wafer W is controlled by the temperature control medium. Further, a gas channel 1038 for supplying a thermally conductive gas as a backside gas to the backside of the wafer W is formed in the mounting table 1003. The gas channel 1038 opens at a plurality of locations on the top surface of the mounting table 1003. A plurality of through holes 1034a communicating with the gas channel 1038 is formed in the electrostatic chuck 1034. The backside gas is supplied to the backside of the wafer W through the through holes 1034a.

A high frequency bias power supply 1031a for supplying a high frequency power of about 0 W to 4000 W having a frequency of, e.g., 13.56 MHz is connected to the lower electrode 1031 via a matching unit 1031b. As will be described later, ions in the plasma are attracted toward the wafer W by the high frequency bias power supplied from the high frequency bias power supply 1031a.

Further, a focus ring 1039 is disposed on an outer peripheral edge portion of the lower electrode 1031 to surround the electrostatic chuck 1034. The plasma is converged toward the wafer W on the mounting table 1003 through the focus ring 1039.

A gas shower head 1004 forming an inner ceiling plate is disposed at the center of the ceiling wall of the processing chamber 1021 so as to face the mounting table 1003. The gas shower head 1004 includes an electrode 1042 formed of a conductive material, e.g., aluminum, and having a circular recess on a bottom surface thereof, and a supporting member 1043 forming a circular-plate shaped shower plate which is formed of a conductive material, e.g., polycrystalline silicon, and covers the bottom surface of the electrode 1042. Although the conductive member in this example is a semiconductor, it may be a conductor, e.g., a metal. The space defined by the electrode 1042 and the supporting member 1043 serves as a gas diffusion space 1041 for diffusing the processing gas.

A DC power supply 1053 serving as a negative voltage supply unit for applying a negative DC voltage of, e.g., about 0 V to −2000 V, is connected to the electrode 1042 via a switch 1052. Upon plasma generation, a sheath having a thickness determined by a value of a voltage applied by the DC power supply 1053 is formed in the region below the gas shower head 1004. Due to the formation of the sheath, the electric field formed (induced) at the peripheral portion of the processing region by an antenna unit 1070 to be described later can be drawn to the central portion of the processing region.

A processing gas supply line 1045 communicating with a gas diffusion space 1041 is formed in a central portion of the electrode 1042. A processing gas supply system 1049 is connected to an upstream side of the processing gas supply line 1045 via a gas supply line 1048. The processing gas supply system 1049 supplies a processing gas to the wafer W. In this example, a gaseous mixture of an etching gas for performing an etching process, e.g., fluorocarbon gas, chlorine ($Cl_2$) gas, carbon monoxide (CO) gas, hydrogen bromide (HBr) gas, ozone ($O_3$) gas or the like, and a dilution gas such as Ar gas or the like is supplied as a processing gas into the processing chamber 1021. Although it is not illustrated, the processing gas supply system 1049 includes a plurality of branch lines provided with, e.g., valves or flow rate control units, and gas sources connected to the respective branch lines. Each of the gas sources stores therein the etching gas or the dilution gas. Hence, a specific etching gas and Ar gas can be supplied at a desired flow rate ratio in accordance with types of etching target films to be etched.

The supporting member 1043 is airtightly pressed against the electrode 1042 via, e.g., a sealing member (not shown) formed at the peripheral edge portion of the top surface thereof. Further, a plurality of gas injection openings 1044 is formed at the supporting member 1043 so that the gas can be supplied from the gas diffusion space 1041 to the wafer W with high in-plane uniformity. In this example, in order to deal with a wafer W having a diameter of, e.g., about 12 inches, the outermost gas injection openings 1044 formed in the gas shower head 1004 are positioned at locations separated from the center of the processing chamber 1021 by, e.g., about 12.0 cm. The outermost gas injection openings 1044 may be positioned at locations separated from the center by about 15 cm (outer edge of the wafer W), or may be positioned closer to the center compared to the locations thereof in this example. The minimum size of the gas shower head 1004 is set within a range which ensures high in-plane uniformity of the gas distribution in the wafer W.

A ring-shaped region surrounding the gas shower head 1004 at the ceiling wall of the processing chamber 1021 includes an outer ceiling plate 1060 which is formed of a dielectric material, e.g., quartz. The outer ceiling plate 1060 and the gas shower head 1004 are airtightly coupled through a ring-shaped sealing member (not shown) formed at, e.g., an inner peripheral end of the outer ceiling plate 1060, and are fixed such that the vertical positions of the lower end surfaces thereof are located at the same height. The outer ceiling plate 1060 is supported at the outer peripheral end thereof by the sidewall of the processing chamber 1021. Here, the vertical position of the outer peripheral end of the ceiling wall is higher than that of the inner peripheral end of the ceiling wall so that the ceiling wall (the gas shower head 1004 and the outer ceiling plate 1060) of the processing chamber 1021 are positioned inside the processing chamber 1021, which allows the gas shower head 1004 and the mounting table 1003 to be positioned close to each other. Moreover, a ring-shaped groove 1061 is formed at the upper end portion of the sidewall of the processing chamber 1021 along the circumferential direction. A sealing member 1062, e.g., an O-ring or the like, is accommodated in the groove 1061. When the inner atmosphere of the processing chamber 1021 is exhausted to vacuum by the vacuum exhaust unit 1023, the outer ceiling plate 1060 is drawn against the processing chamber 1021, and airtightness of the processing chamber 1021 is maintained by the sealing member 1062.

Figure 19:
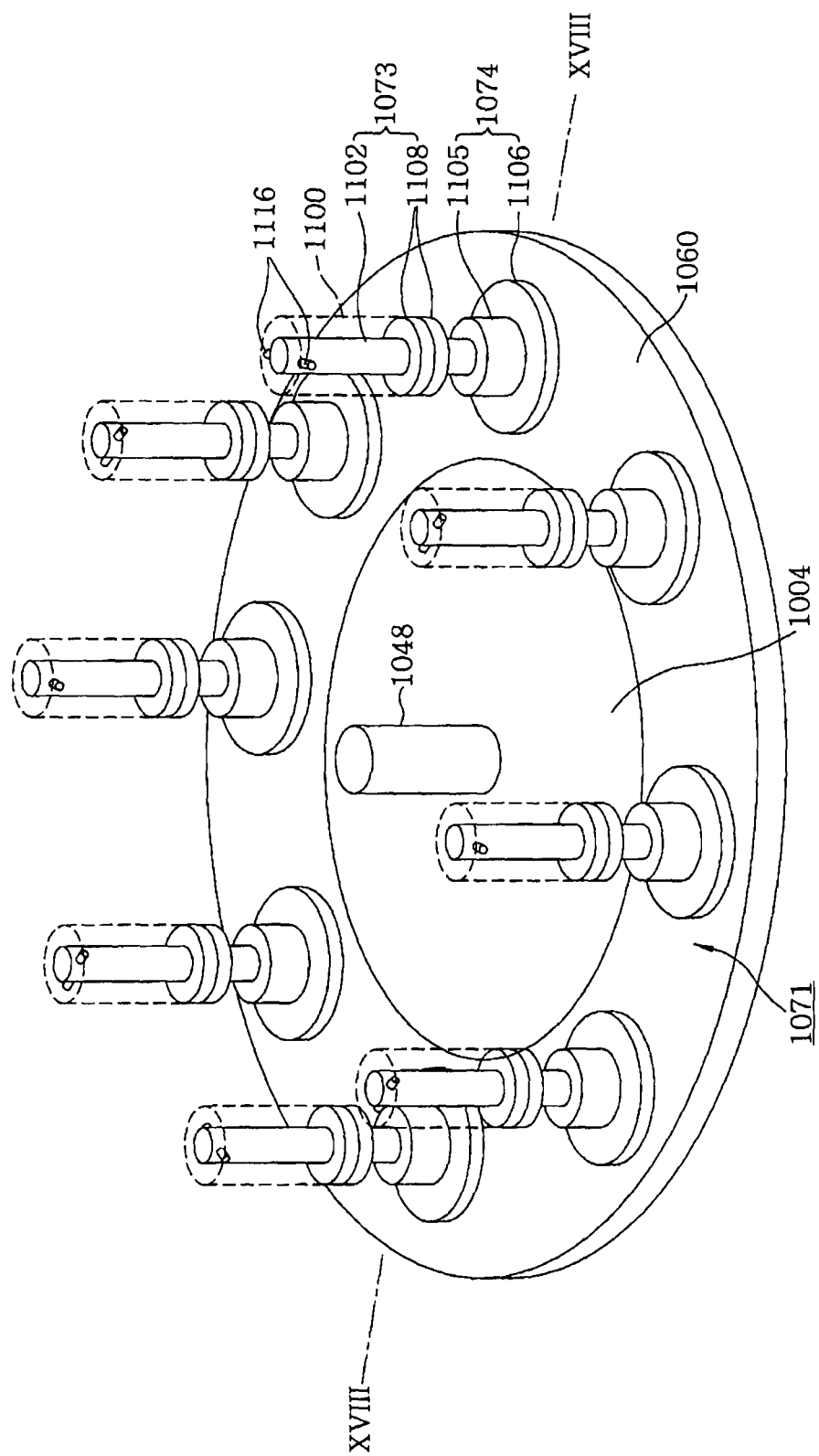
FIG. 19 is a perspective view of the gas shower head of the plasma processing apparatus shown in FIG. 18 which is viewed from the top.

As shown in FIG. 19, antenna modules 1071 constituting a microwave supply unit are provided at a plurality of, e.g., eight, locations spaced apart from each other at regular intervals along the circumferential direction of the outer ceiling plate 1060. The antenna modules 1071 are connected in parallel with a microwave output unit 1080, and a plasma is generated in the region below the antenna modules 1071, i.e., the region surrounding the space below the gas shower head 1004, by the microwave electric field. By supplying the microwaves to the antenna modules 1071 and employing the slot arrangement of FIG. 23, the electric field Er directed from the peripheral portion to the central portion of the processing chamber 1021 and vise versa is formed along the circumferential direction. These antenna modules 1071 constitute an antenna unit 1070.

Figure 20:
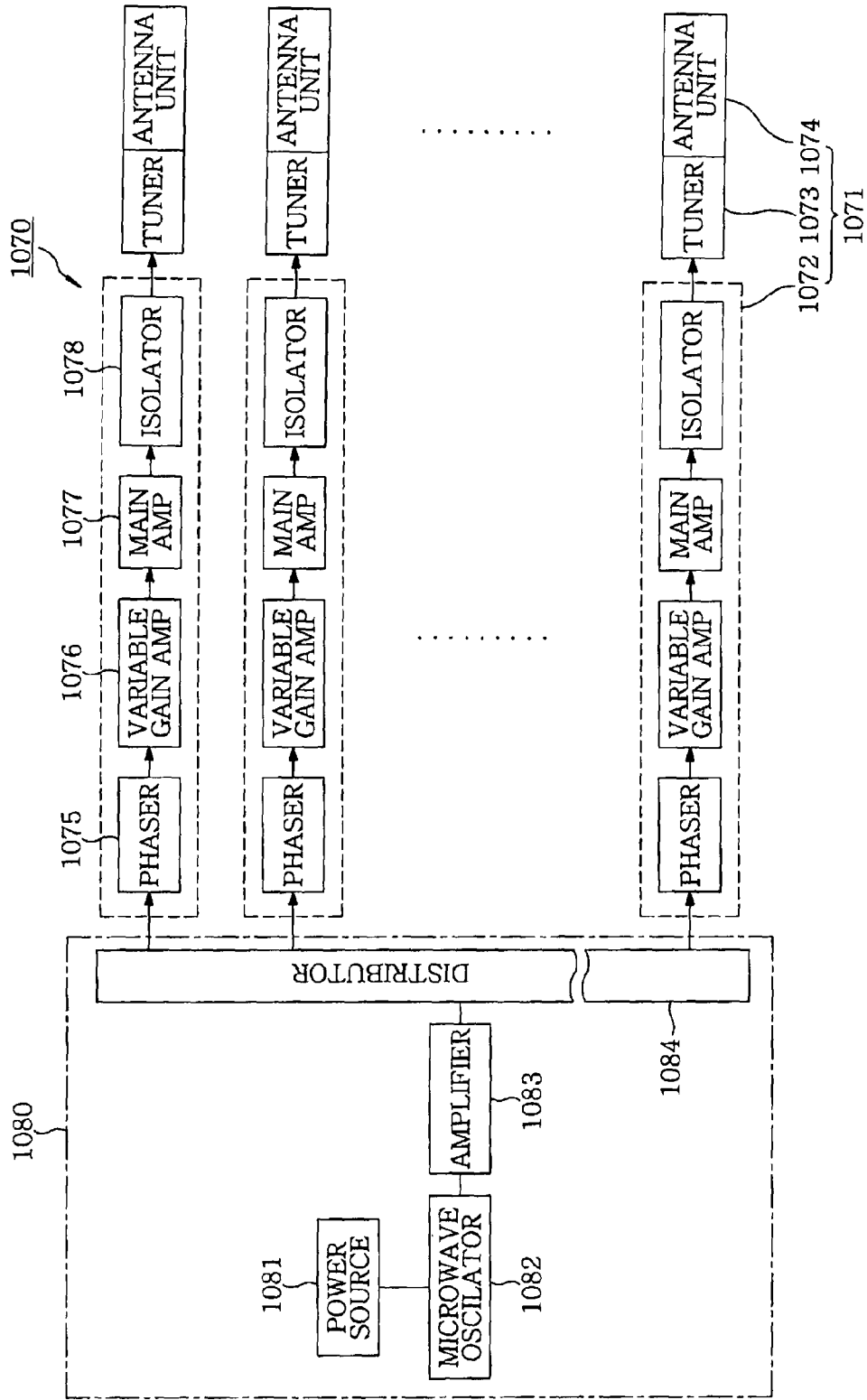
FIG. 20 is a schematic view showing functions of an antenna module and a microwave output unit of the present embodiment.

As shown in FIG. 20, the microwave output unit 1080 includes a power supply unit 1081 for supplying a power of, e.g., about 500 W to 3000 W, a microwave oscillator 1082 for oscillating microwaves having a frequency of, e.g., 2.45 GHz, an amplifier 1083 for amplifying the oscillated microwaves, and a distributor 1084 for distributing the microwave to the antenna modules 1071. Each of the antenna modules 1071 has an amplifier section 1072 for amplifying the microwave distributed by the distributor 1084, a tuner 1073 for matching impedances, and an antenna section 1074 for radiating the amplified microwave into the processing chamber 1021. The amplifier section 1072 has a phase shifter 1075, a variable gain amplifier 1076 for controlling a level of the microwave power supplied to each of the antenna modules 1071, a main amplifier 1077 serving as a solid state amplifier, and an isolator 1078 for separating the microwave reflected by the antenna section 1074 and returning to the main amplifier 1077.

The phase shifter 1075 is configured to shift the phase of the microwave by using a slag tuner, and the radiation characteristics of the microwave can be modulated by controlling the slag tuner. The phase shifter 1075 shifts the phase of the microwave applied to each of the antenna modules 1071 by using the slag tuner, so that the directivity of the microwave can be controlled and, also, the plasma distribution can be adjusted. Or, a circular polarized wave can be obtained by varying the direction of slots 1101a to be described later by about 90° between neighboring antenna modules 1071 to shift the phase of the microwave by about 90° between the neighboring antenna modules 1071.

Figure 21:
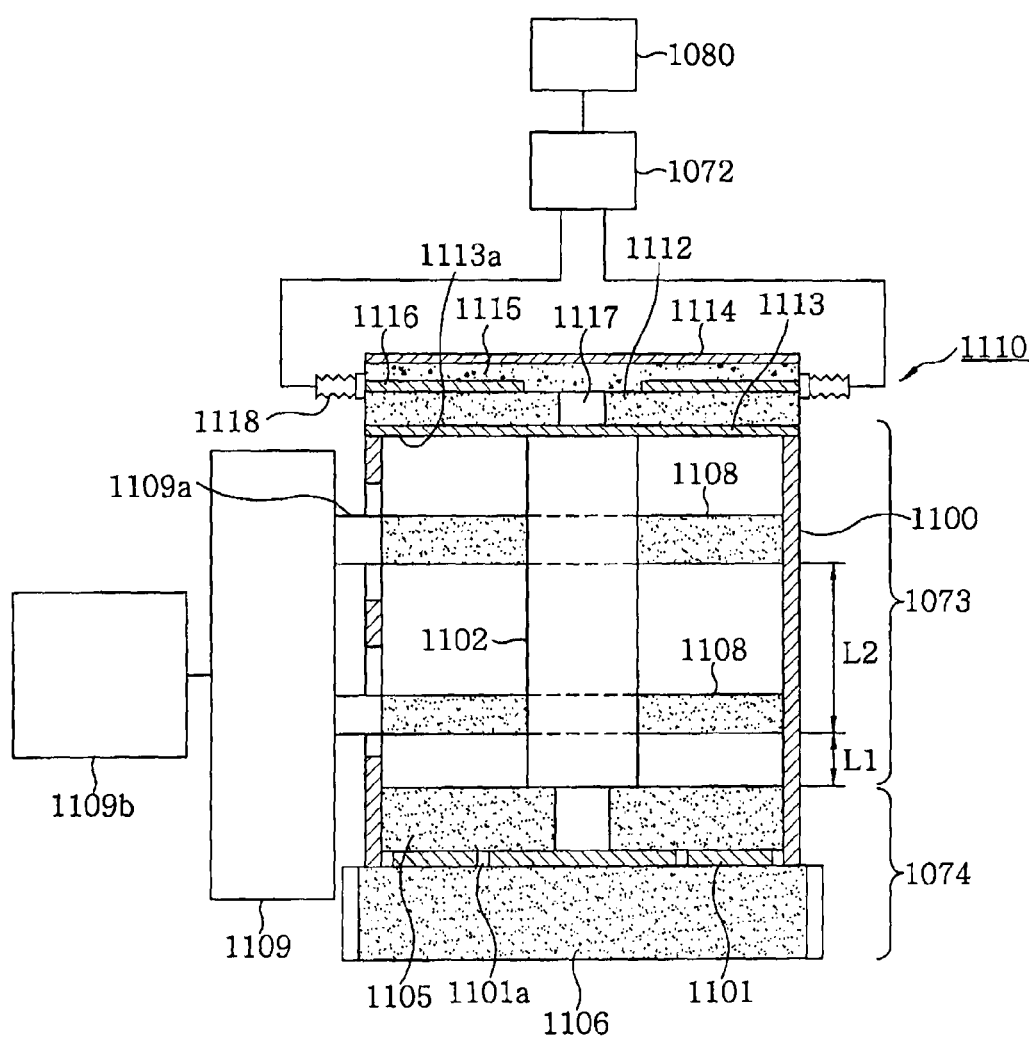
FIG. 21 is a vertical cross sectional view showing an example of the antenna module of the present embodiment.
Figure 22:
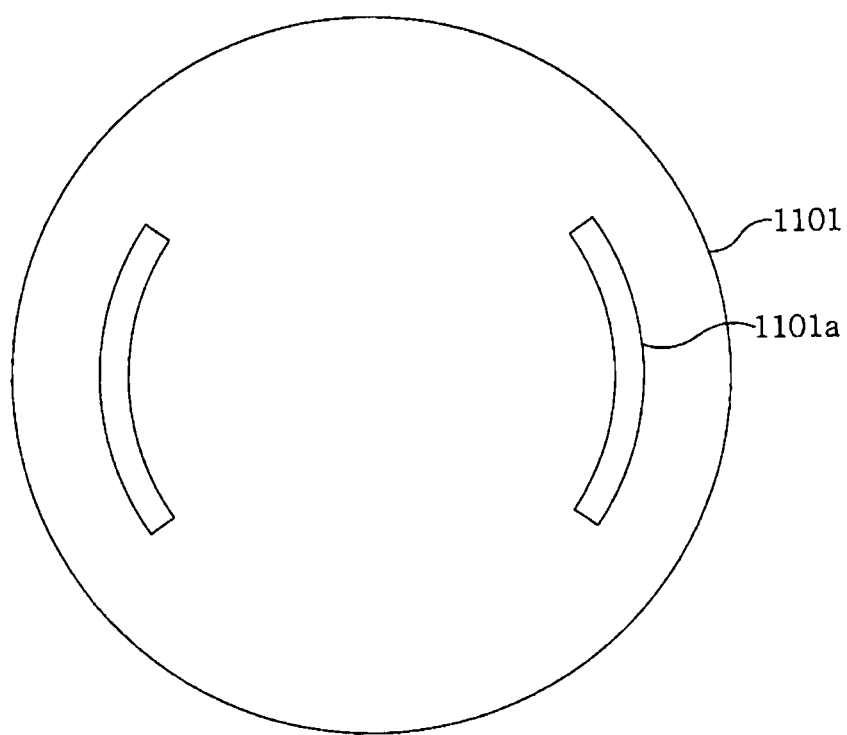
FIG. 22 is a top view of a planar slot antenna of the antenna module of the present embodiment.

Hereinafter, the detailed configuration of the antenna modules 1071 will be described. As shown in FIG. 21, the tuner 1073 and the antenna section 1074 are accommodated in that order from the top in a substantially cylindrical housing 1100 formed of, e.g., a metal. The housing 1100 has a lower portion having an outwardly swollen shape and serves as an outer conductor of a coaxial tube. As shown in FIG. 22, the antenna section 1074 includes: an approximately circular plate-shaped planar slot antenna 1101 having two arc-shaped slots 1101a disposed opposite to each other; a ring-shaped wave retardation member 1105 provided above the planar slot antenna 1101, for controlling the plasma density by shortening the wavelength of the microwave in vacuum; and a ceiling plate 1106 provided below the planar slot antenna 1101 and formed of a dielectric material, e.g., quartz, ceramics or the like. A metal rod 1102 serving as an inner conductor of the coaxial tube is connected to the central portion of the top surface of the planar slot antenna 1101 and extended upward through the inner peripheral side of the wave retardation member 1105.

Figure 23:
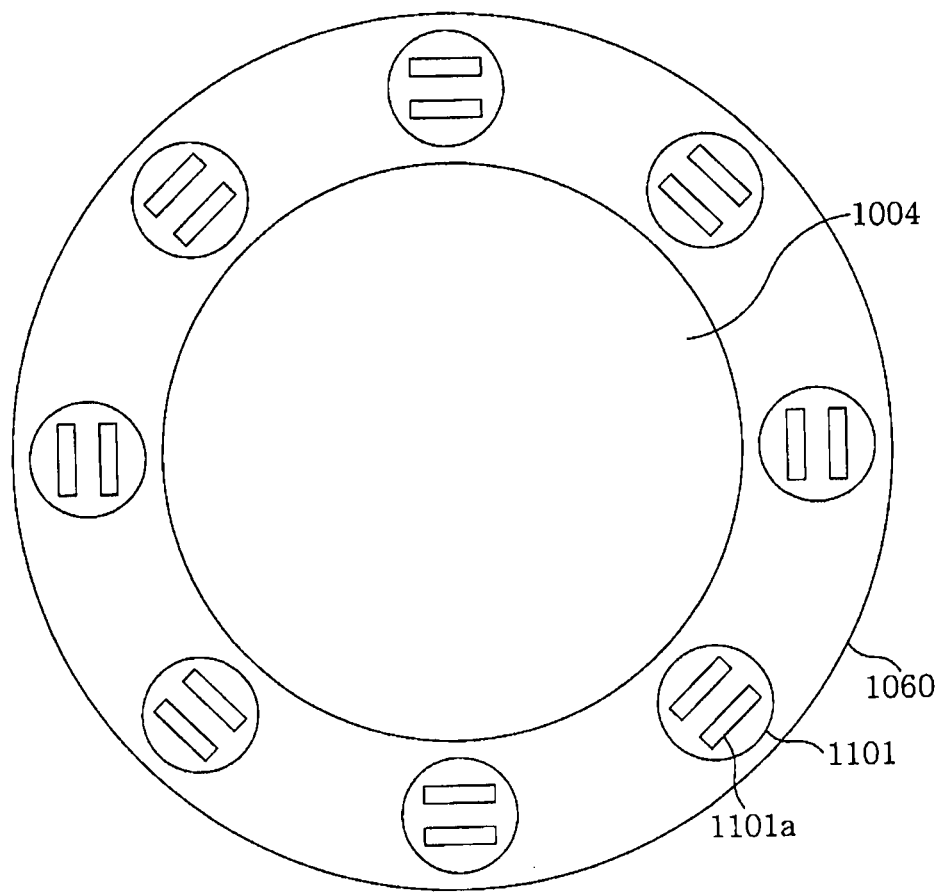
FIG. 23 is a top view showing arrangement of slots of the planar slot antenna of the antenna module of the present embodiment.

As shown in FIG. 23, in each of the antenna modules 1071, two slots 1101a are provided opposite to each other substantially in the diametrical direction of the gas shower head 1004. FIG. 23 schematically shows the shape of the slot 1101a. As shown in FIG. 22, the slots 1101a are preferably formed in an arc shape. Preferably, each of the planar slot antennas 1101 has two slots 1101a as in this example or four slots 1101a spaced apart from each other at regular intervals along the circumferential direction.

The ceiling plate 1106 allows the microwaves supplied from the microwave output unit 1080 to be introduced into the processing chamber 1021 therethrough.

The tuner 1073 has two ring-shaped slags 1108 formed of a dielectric material, e.g., quartz. The slags 1108 are spaced apart from each other in a vertical direction and the metal rod 1102 vertically extends through the slags 1108. Further, the slags 1108 are connected to a driving unit 1109 provided outside the housing 1100 through arms 1109a extending from the outer side of the housing 1100 to be vertically movable. A controller 1109b is connected to the driving unit 1109 and controls vertical positions L1 and L2 of the slags 1108 in each of the antenna modules 1701 such that the impedance of the antenna modules 1071 seen from the microwave output unit 1080 becomes about 50Ω in accordance with the instruction from a control unit 1007 to be described later.

Figure 24:
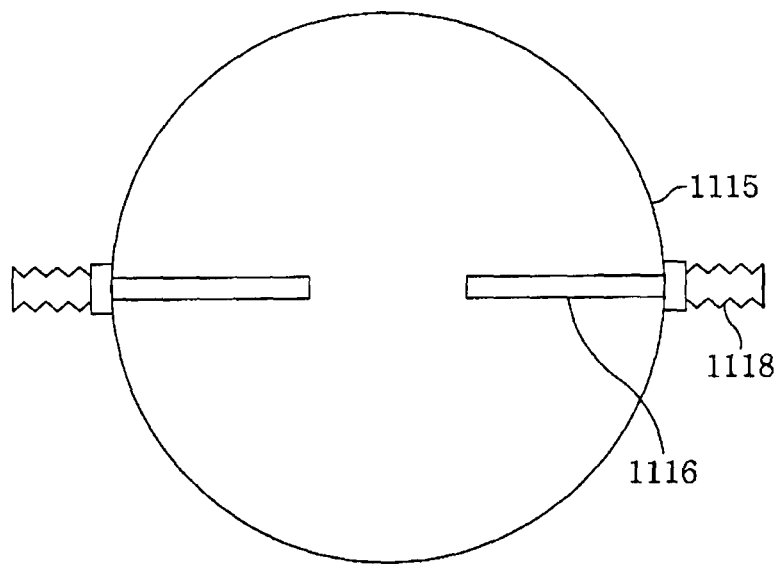
FIG. 24 is a top view of a printed circuit board of the antenna module of the present embodiment.

A power supply excitation plate 1110 for non-contact supply is provided above the tuner 1073 so as to be connected to the upper end of the metal rod 1102. The power supply excitation plate 1110 includes a dielectric board 1115 formed of a printed circuit board (PCB) or the like, and a ring-shaped dielectric member 1112 provided below the dielectric board 1115 and formed of a dielectric material, e.g., quartz. As shown in FIG. 24, two microstrip lines 1116 formed of a conductor, e.g., Cu or the like, are formed at the backside of the dielectric board 1115. The microstrip lines 1116 extend opposite to each other from the outer periphery toward the center with the leading ends thereof separated from each other.

Connectors 1118 are attached to the end portions of the microstrip lines 1116 at the circumferential edge of the dielectric board 1115 and connected to the amplifier section 1072. Therefore, the (spatially) combined microwave power is supplied from the two connectors 1118 to the tuner 1073. A single pair or three or more pairs of the microstrip lines 1116 and the connectors 1118 may be provided instead of two pairs of the microstrip lines 1116 and the connectors 1118. In FIG. 21, reference numeral "1114" indicates a reflecting plate for reflecting the microwaves.

Figure 18:
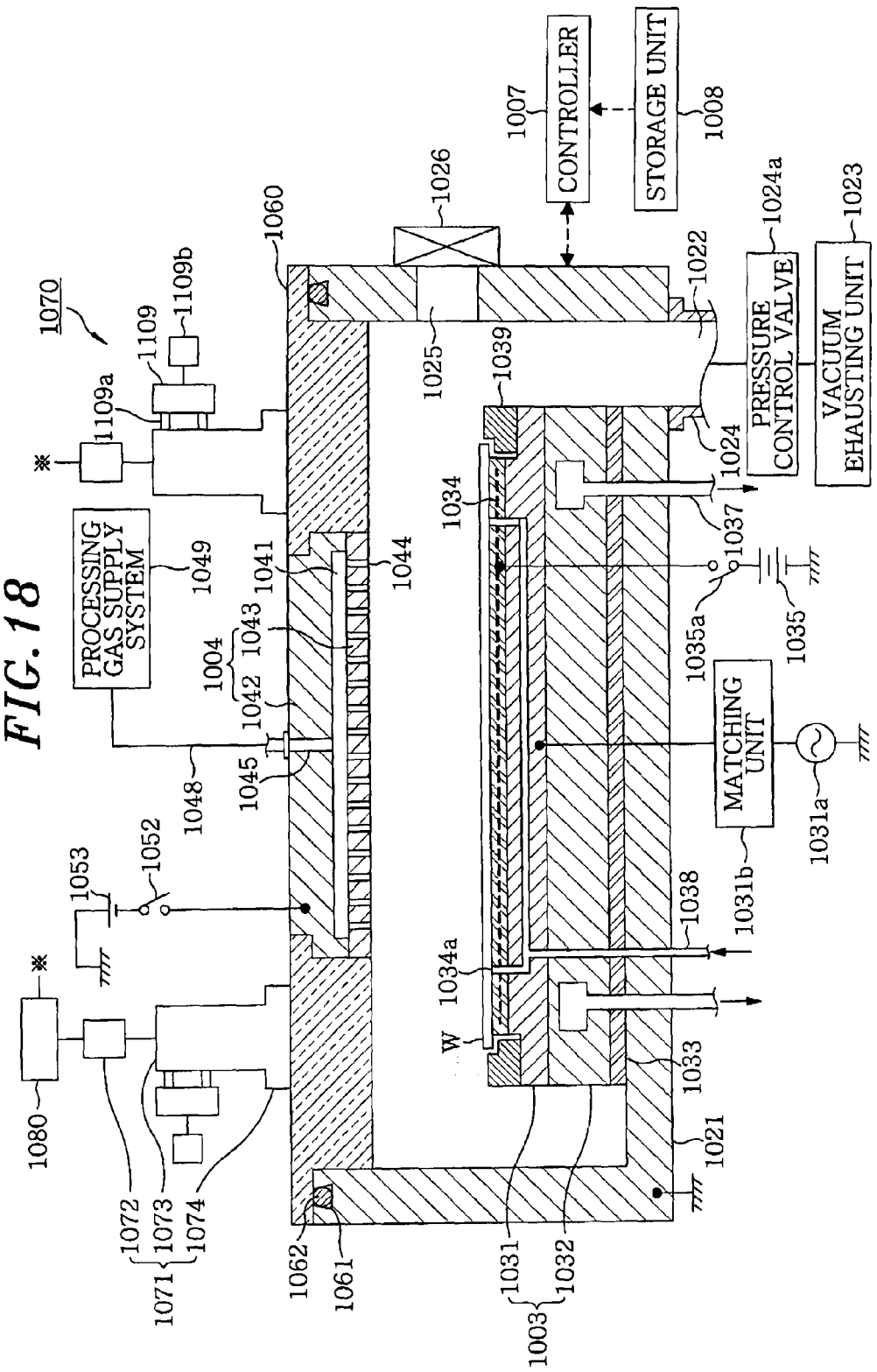
FIG. 18 is a vertical cross sectional view showing another embodiment of the plasma processing apparatus of the present invention.

A circular plate-shaped slot antenna 1113 formed by copper plating and having two arc-shaped slots 1113a opposite to each other as in the aforementioned planar slot antenna 1101 is provided at the bottom surface of the dielectric member 1112. In each of the antenna modules 1071, the slots 1113a are arranged in the same orientation as that of the slots 1101a of FIG. 23, and the slots 1113a have a length of, e.g., about ½×λg (λg: wavelength of the microwave in the waveguide). The dielectric member 1112 serves as a resonator together with the slot antenna 1113 and has a central portion through which a central conductor 1117 extends to connect the bottom surface of the dielectric board 1115 with the slot antenna 1113. The slots 1113a may be provided at a plurality of, e.g., four, locations spaced apart from each other at regular intervals along the circumferential direction, or may be formed in, e.g., a linear shape, instead of the arc shape. Besides, the power may be supplied to make a monopole antenna in which the microwave has a wavelength of ¼×λg without providing the slots 1113a. FIG. 18 is a vertical cross sectional view of the processing chamber 1021 which is taken along line XVIII-XVIII in FIG. 19. In FIG. 19, the illustration of the power supply excitation plate 1110 is omitted.

Figure 25A:
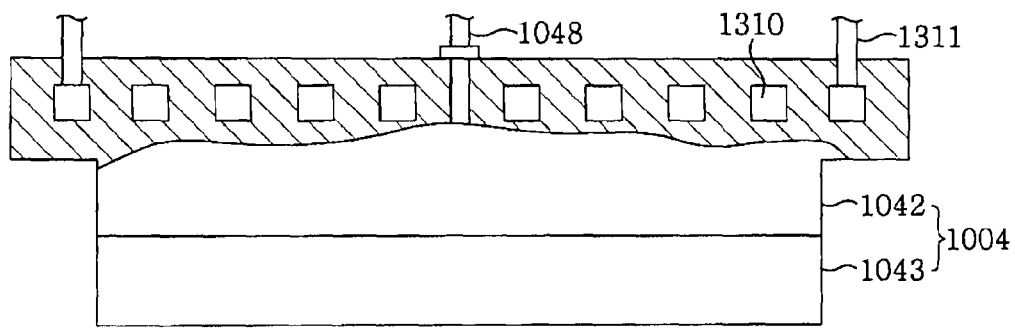
FIGS. 25A and 25B are schematic views of an example of a cooling unit of the gas shower head shown in FIG. 18.
Figure 25B:
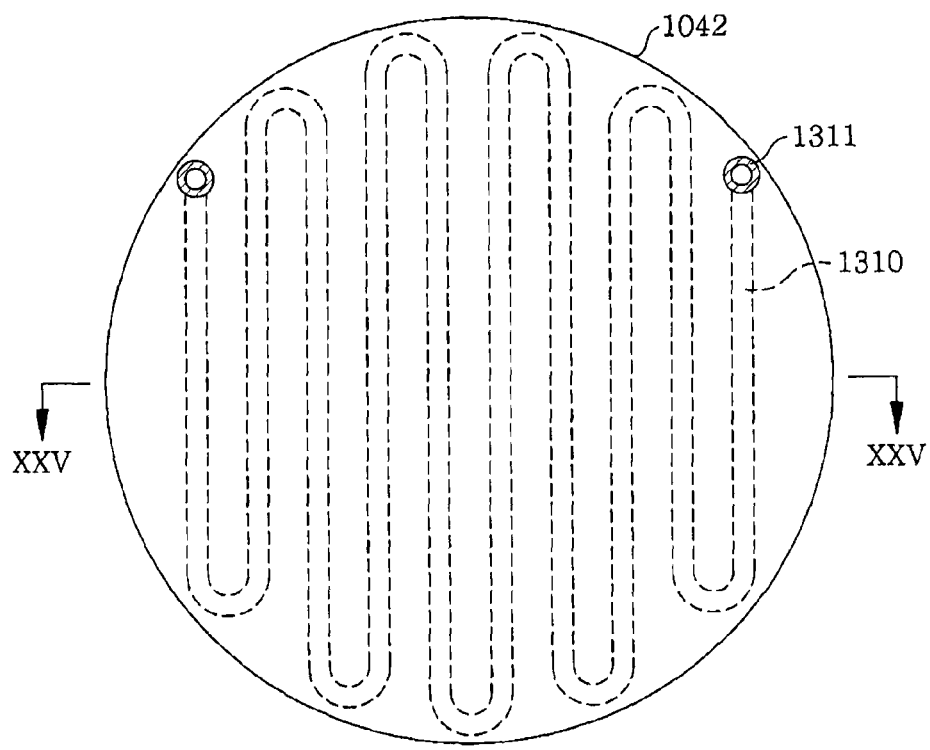

Although it is not shown in FIG. 18, the gas shower head 1004 has a cooling unit. Specifically, as shown in FIGS. 25A and 25B, the cooling unit includes a temperature control medium path 1310 that is horizontally formed in a serpentine shape so as not to interfere with the processing gas supply line 1045 in the electrode 1042. The temperature of the gas shower head 1004 can be controlled by circulating the control medium having a temperature controlled to a predetermined level, e.g., water, in the temperature control medium path 1310 via a temperature control fluid port 1311. FIG. 25A is a vertical cross sectional view of the gas shower head 4 which is taken along line XXV-XXV in FIG. 25B.

Figure 26:
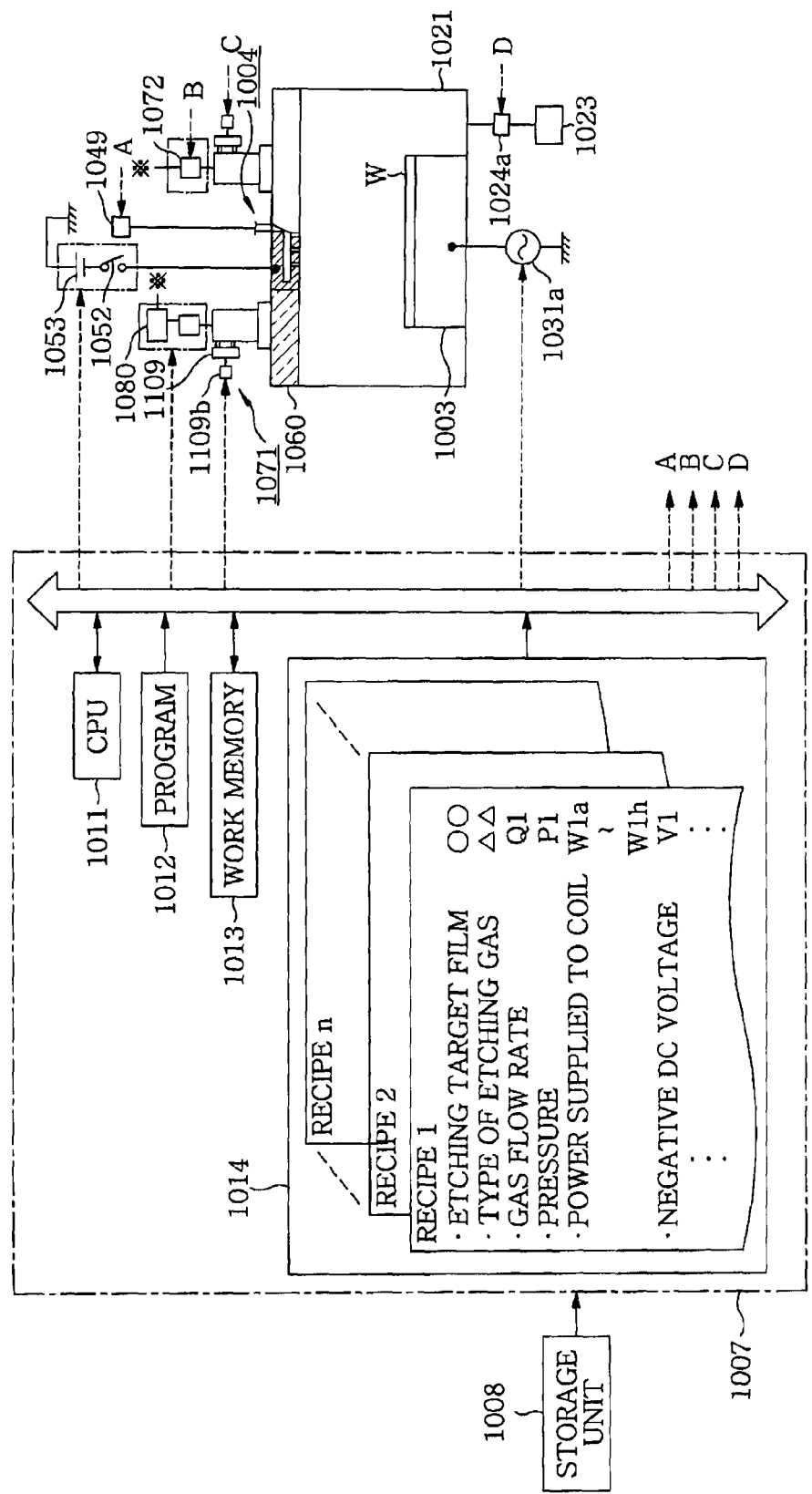
FIG. 26 is a schematic view showing a control unit of the plasma processing apparatus shown in FIG. 18.

As shown in FIG. 26, a control unit 1007 is connected to the plasma processing apparatus. The control unit 1007 includes a CPU 1011, (a program storage unit for storing) a program 1012, a work memory 1013, and a memory 1014 as a data storage. The memory 1014 is provided with areas for storing processing conditions for each recipe, such as a type of a film to be etched (etching target film), a type of an etching gas, a gas flow rate, a processing pressure, a temperature of the gas shower head 1004, a value of a high frequency power supplied to each of the antenna modules 1071, a value of a negative DC voltage applied from the DC power supply 1053 and the like.

As will be described later, different types of multilayer films are laminated on the wafer W. Hence, when an etching process is performed on these multilayer films, an etching gas needs to be changed for each film and, also, the flow rate of the etching gas, the processing pressure and the like need to be changed for each film. In order to perform a uniform etching process over the surface of the wafer W, the etching gas needs to be converted into a plasma uniformly over the surface of each film. Especially, a plasma needs to be generated uniformly in the diametrical direction of the wafer W. In the present embodiment, in order to improve the in-plane uniformity of the amount (concentration) of the plasma generated by the electric, the intensity of the electric field generated at the peripheral portion of the processing region by the antenna modules 1071 and the intensity of the electric field induced to the central portion of the processing chamber by the negative DC voltage are controlled on a film basis by controlling the value of the negative voltage applied to the gas shower head 1004.

For example, the amount of the plasma generated by the microwave electric field can be uniformly distributed in the circumferential direction by controlling, on a film basis, the microwave power supplied to each of the antenna modules 1071 by the variable gain amplifier 1076. In other words, in the present embodiment, the amount of the plasma can be uniformly distributed on the surface of each film of the wafer W (in the diametrical and the circumferential direction). To do so, a value of a voltage to be applied to the gas shower head 1004 and a value of a microwave power to be supplied to the antenna modules 1071 are obtained in advance on a film (recipe) basis by performing tests or calculations, and the obtained values are stored on a recipe basis. Without obtaining the values in advance on a recipe basis, the corresponding values may be obtained whenever the process is performed.

Further, only the negative DC voltage may be changed on a recipe basis while fixing the value of the microwave power to be supplied to the antenna modules 1071 to the same level in a plurality of recipes.

The program 1012 has an instruction for the CPU 1011 to read out a recipe corresponding to a film to be etched from the memory 1014 to the work memory 1013 and send a control signal to each unit of the plasma processing apparatus in accordance with the recipe to thereby execute steps to be described later and perform an etching process. Generally, this program (including a program for inputting and displaying processing parameters) 1012 is stored in the storage unit 1008, e.g., a hard disk, a compact disk, a magneto-optical disk, a memory card or the like, and installed from the storage unit 1008 to the control unit 1007 (the program storage unit 1012 thereof).

Hereinafter, the operation of the plasma processing apparatus will be described with reference to FIGS. 27 to 31.

The following is brief description of a semiconductor wafer (hereinafter, referred to as a "wafer") W as a substrate to be processed. The wafer W has a silicon film and films laminated thereon. The laminated films include a photoresist mask having a predetermined pattern, a bottom anti-reflection coating film formed of, e.g., an organic film, an amorphous carbon film, an insulating film ($SiO_2$ film or SiCOH film) or a Poly-Si (polycrystalline silicon) film, an etching stop film formed of, e.g., an inorganic film, and the like, which are laminated in that order from the top.

First, a recipe for an etching target film formed on the surface of the wafer W is read out from the memory 1014 to the work memory 1013. In this example, the etching target film is, e.g., a bottom anti-reflection coating film, so that the recipe for this film is read out. Next, the wafer W is loaded from a vacuum transfer chamber (not shown) maintained at a vacuum atmosphere into the processing chamber 1021 by a substrate transfer unit (not shown) and mounted on the mounting table 1003. Thereafter, the gate valve 1026 is closed, and the inside of the processing chamber 1021 is fully evacuated by the vacuum exhaust unit 1023 by fully opening the pressure control valve 1024a, for example. At the same time, the temperature control medium having a temperature controlled to a predetermined level and the backside gas are supplied from the temperature control medium channel 1037 and the gas channel 1038, thereby controlling the temperature of the wafer W to a predetermined level. By circulating in the temperature control medium path 1310 the temperature control medium having a temperature controlled to a predetermined level through the temperature control fluid port 1311, the temperature of the gas shower head 1004 is controlled to a predetermined level.

Next, a microwave power having a frequency of, e.g., 2.45 GHz, is supplied at a power level of, e.g., about 0 W to 4000 W, from the microwave output unit 1080 to the antenna modules 1071 and, also, a high frequency bias power is supplied from the high frequency power supply 1031a to the mounting table 1003. The microwave oscillated by the microwave oscillator 1082 of the microwave output unit 1080 is amplified by the amplifier 1083 and then distributed to the antenna modules 1071 by the distributor 1084. The microwaves are amplified by the variable gain amplifier 1076 and the main amplifier 1077 in each of the antenna modules 1071 and output from the two microstrip lines 1116. Then, the microwaves are combined and supplied into the processing chamber 1021 via the planar slot antenna 1101.

By supplying the microwaves to the antenna modules 1071 and employing the slot arrangement of FIG. 23, the electric field Er directed in the diametrical direction of the wafer W (from the central portion to the peripheral portion of the processing chamber 1021 and vice versa) along the circumferential direction is formed in the region surrounding the space below the gas shower head 1004 through the outer ceiling plate 1060. Further, a negative DC voltage of, e.g., about −500 V, is applied to the gas shower head 1004. Due to the application of the negative DC voltage, a negative electric field is formed near the bottom surface of the gas shower head 1004.

Figure 27:
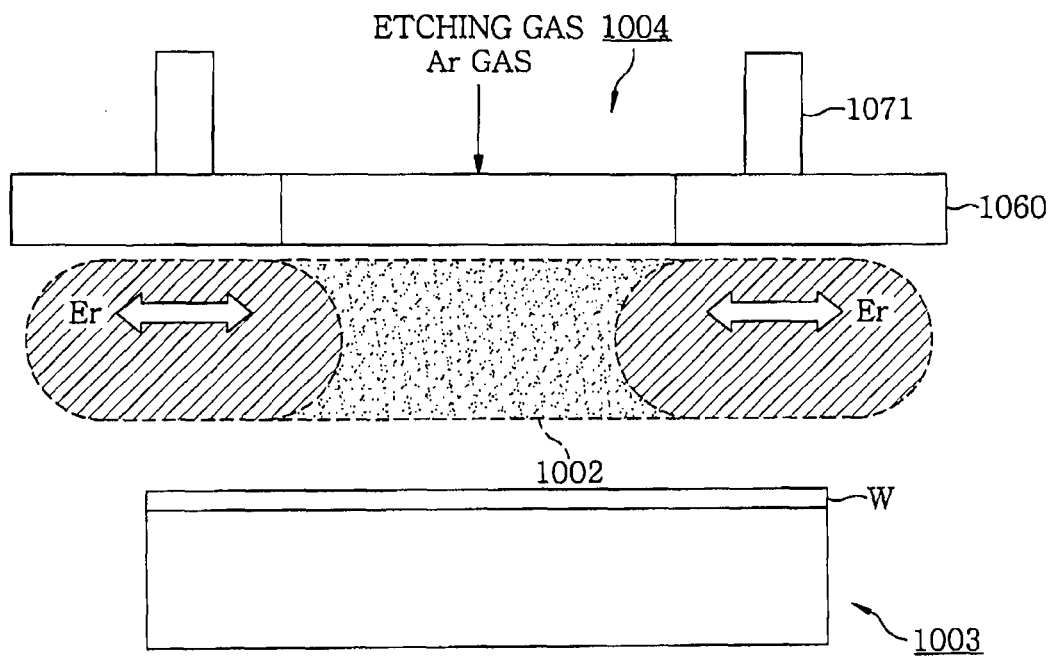
FIG. 27 is a schematic view showing a state in which an etching gas is turned into a plasma in the plasma processing apparatus shown in FIG. 18.

Then, Ar gas is supplied together with the etching gas from the processing gas supply system 1049 into the processing chamber 1021, thereby controlling the pressure in the processing chamber 1021 to a predetermined level, e.g., about 5.3 Pa (40 mTorr). Ar gas is activated at a low energy and thus is preferably supplied into the processing chamber 1021 together with the etching gas. The processing gas as a gaseous mixture of the etching gas and Ar gas is diffused into the processing chamber 1021 and turned into a plasma below the antenna modules 1071 by the electric field Er. The plasma thus generated includes $Ar^+$ ions, ions and electrons of the etching gas material and the like. The plasma generated at the peripheral portion of the processing region is diffused to the central portion of the gas shower head 1004 in the processing chamber 1021. The gas at the central portion is turned into a plasma by the plasma diffused to the central portion. Hence, a plasma 1080 is generated horizontally over the entire processing region. If a negative DC voltage is not applied to the gas shower head 1004, a plasma is generated mainly in the region below the antenna modules 1071, and the plasma density at the central portion becomes lower than that at the peripheral portion, as can be seen from FIG. 27. In FIG. 27, the region where the plasma density is high is indicated by oblique lines.

Figure 28:
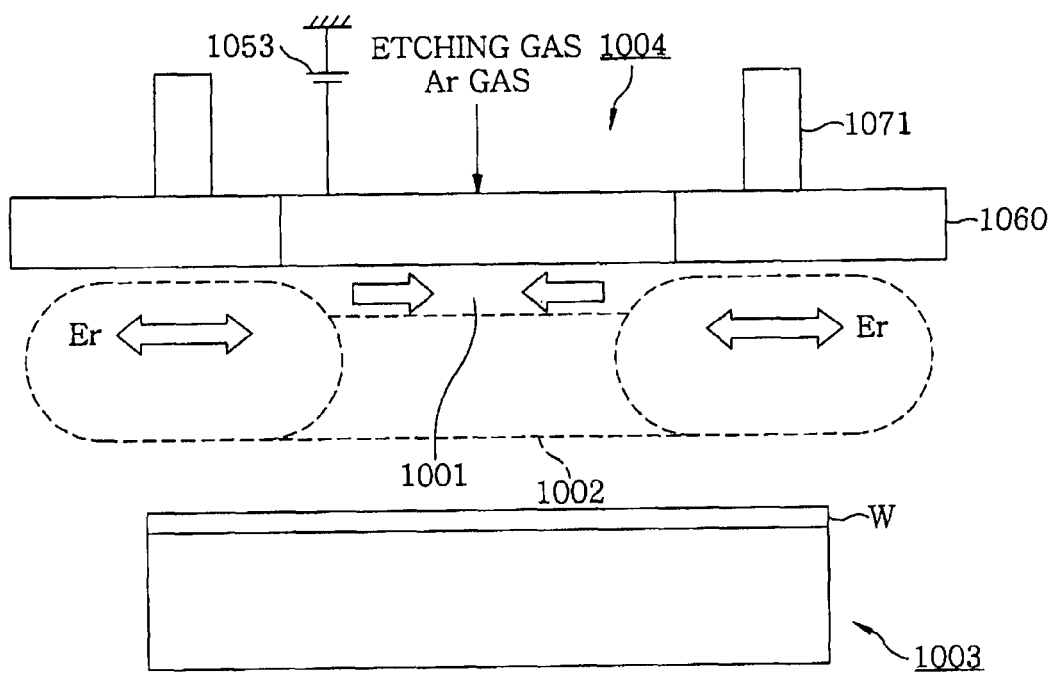
FIG. 28 is a schematic view showing a state in which an etching gas is turned into a plasma in the plasma processing apparatus shown in FIG. 18.

However, in the present embodiment, the negative DC voltage is applied to the gas shower head 1004, so that a negative electric field is generated in a region near the bottom surface of the gas shower head 1004, and a thick DC sheath 1001 is formed immediately therebelow. The DC sheath 1001 has a thickness determined by the value of the negative DC voltage. Further, as shown in FIG. 28, the electric field Er is directed toward the central portion of the gas shower head 1004 and penetrates the DC sheath 1001. Accordingly, a plasma is uniformly generated over the surface of the wafer W. The reason thereof is considered as follows.

In other words, the electric field Er generated at the peripheral edge of the gas shower head 1004 is strongly attracted toward the central portion of the gas shower head 1004 by the DC sheath 1001, which leads to generation of an electric field having a high intensity below the gas shower head 1004. Hence, the processing gas injected from the gas shower head 1004 is instantly turned into a plasma by the electric field attracted toward the region below the gas shower head 1004. Even if the processing gas is not turned into a plasma by the electric field, when the processing gas reaches the region below the antenna modules 1071, it is turned into a plasma by the high-intensity electric field Er in that region. Further, when the processing gas that has not been turned into a plasma reaches the region below the DC sheath 1001, it is turned into a plasma by absorbing the electric field energy from the DC sheath 1001.

When the plasma 1002 flows downward and the electrons in the plasma 1002 collide with the processing gas, the processing gas is turned into a plasma. Then, electrons generated from this plasma collide with the processing gas, so that the sequential generation of plasma is continued to increase the density of the plasma 1002 as shown in FIG. 29. The electric field Er by the antenna modules 1071 is diffused to the region below the gas shower head 1004 via the DC sheath 1001, and the plasma 1002 generated by this electric field is directed downward toward the wafer W by a downward exhaust flow. As a consequence, a highly uniform plasma 1002 is generated over the surface of the wafer W (in the diametrical and the circumferential direction).

As shown in FIG. 30, positive ions in the plasma, e.g., $Ar^+$ ions, are strongly attracted by the negative electric field of the DC sheath 1001 and thus collide with the gas shower head 1004. As a result of the collision, secondary electrons are generated from the gas shower head 1004 and accelerated in the DC sheath 1001. The accelerated secondary electrons directed downward, and the processing gas is turned into a plasma by these secondary electrons. Therefore, the density of the plasma 1002 above the wafer W is increased, and the in-plane uniformity of the plasma density is further improved.

Figure 31:
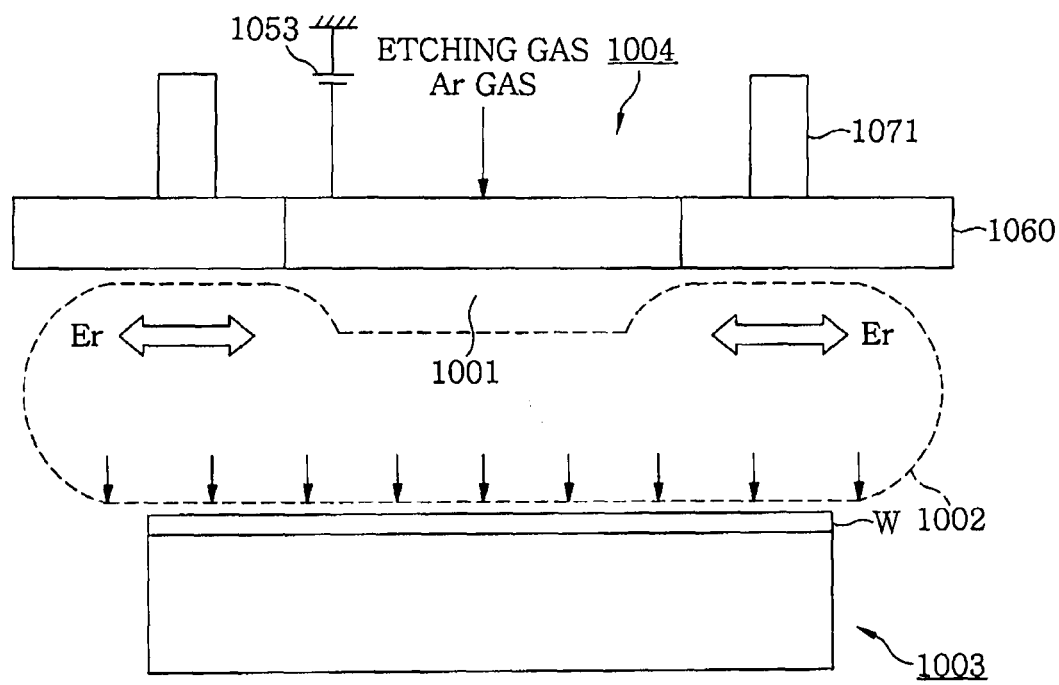
FIG. 31 is a schematic view showing a state in which an etching gas is turned into a plasma in the plasma processing apparatus shown in FIG. 18.

As shown in FIG. 31, ions in the plasma are attracted toward the wafer W by the high frequency bias power from the high frequency power supply 1031a, so that a vertical etching process is carried out. The bottom anti-reflection coating film is etched until the amorphous carbon film formed under the bottom anti-reflection film is exposed.

Thereafter, the supply of the etching gas and Ar gas is stopped and, also, the supply of the microwaves to the antenna modules 1071 and the application of the negative DC voltage to the shower head 1004 are stopped. Next, the processing chamber 1021 is exhausted to vacuum, and a recipe for an amorphous carbon film to be etched is read from the memory 1014 to etch the amorphous carbon film. Then, in the same manner, a recipe for a film formed under the amorphous carbon film is read out to perform an etching process on the film formed thereunder.

In accordance with the aforementioned embodiment, the gas shower head 1004 having a conductive member is provided at the central portion of the ceiling wall of the processing chamber 1021, so that the gas can be supplied uniformly over the surface of the wafer W. Further, a plasma is uniformly generated by the antenna modules 1071 in the region surrounding the space below the gas shower head 1004 along the circumferential direction, and the DC sheath 1001 is formed therebelow by applying a negative DC voltage to the gas shower head 1004. The plasma 1002 is diffused to the central portion via the DC sheath 1001. Accordingly, while using the microwaves, the gas can be uniformly supplied from the gas shower head 1004 and the plasma 1002 can be generated uniformly along the surface of the wafer W and also in the space below the gas shower head 1004. As a result, the plasma process having high in-plane uniformity, e.g., the etching process in this example, can be performed on the wafer W.

Further, the plasma 1002 having high in-plane uniformity in accordance with the processing recipe can be easily obtained by controlling the thickness of the DC sheath 1001 by the negative DC voltage applied to the gas shower head 1004 and controlling the microwave power supplied to each of the antenna modules 1071. In this plasma processing apparatus, the plasma 1002 using microwaves can be generated simply by providing the antenna modules 1071 above the ceiling plate (outer ceiling plate 1060) of the processing chamber 1021. Thus, the plasma processing apparatus of the present embodiment has a simple configuration and can be achieved cost effectively. Although a conventional plasma processing apparatus is disadvantageous in that it is difficult to supply a gas to a substrate having a large area, the plasma processing apparatus of the present embodiment does not have such disadvantage.

In the above-described apparatus, the gas shower head 1004 may be physically eroded through a so-called sputtering by impact of Ar⁺ ions. Since, however, the bottom surface of the gas shower head 1004 is formed of silicon, there is no fear of contamination. Besides, the etching gas is uniformly supplied from the gas shower head 1004, so that the gas shower head 1004 and the mounting table 1003 can be disposed adjacent to each other, and the height of the processing chamber 1021 can be reduced. Further, the temperature of the gas shower head 1004 can be controlled on a recipe basis by forming the temperature control medium path 1310 substantially throughout the supporting member 1043.

Figure 32:
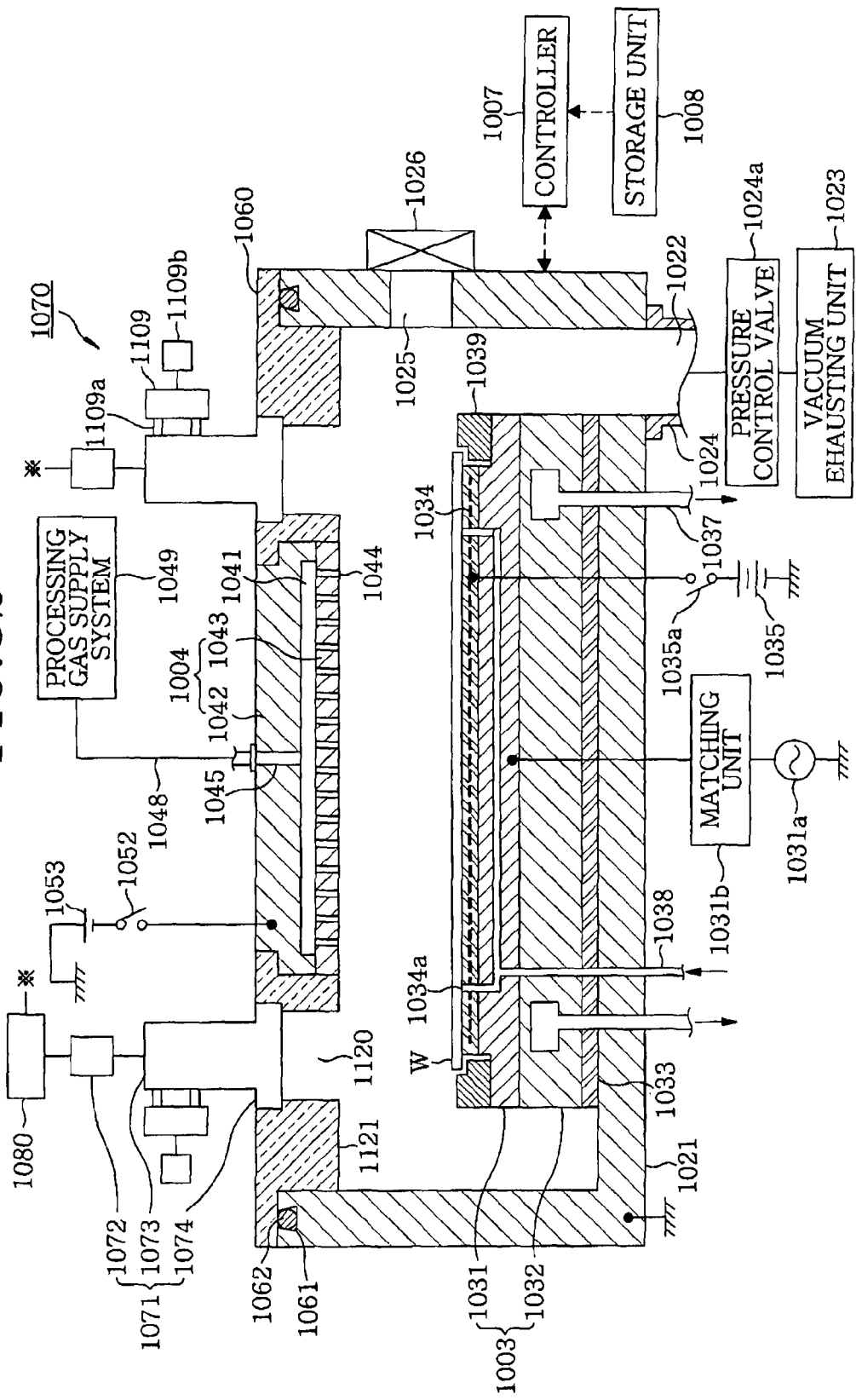
FIG. 32 is a vertical cross sectional view of still another embodiment of the plasma processing apparatus.

In the above example, the antenna modules 1071 are installed above the outer ceiling plate 1060. However, as shown in FIG. 32, the antenna modules 1071 can be airtightly buried in circular openings 1120 formed at a plurality of, e.g., eight, locations along the circumferential direction of the outer ceiling plate 1060 while being spaced apart from each other at regular intervals. In this case, by cutting an upper portion of each of the openings 1120 in a larger size than a lower portion thereof, an annular engaging stepped portion 1121 is formed at the lower portion of the opening 1120, and the antenna module 1071 is airtightly maintained by engaging the step surface of the engaging stepped portion 1121 with the engaged surfaces corresponding to the lower peripheral edge of the antenna module 1071 via, e.g., an O-ring or the like. In the plasma etching processing apparatus configured as described above, the plasma is uniformly generated across the surface and the same effects as that of the above example are obtained.

At this time, the region below the antenna modules 1071 communicates with the processing region, so that the outer ceiling plate 1060 may be formed of a metal, e.g., aluminum. Further, the antenna modules 1071 may be installed below the outer ceiling plate 1060 in the processing chamber 1021. In this case as well, the outer ceiling plate 1060 may be formed of a conductive material, e.g., a metal. When the outer ceiling plate 1060 is formed of a conductive material as in the above-described example, it is preferable to install an insulation member between the outer ceiling plate 1060 and the gas shower head 1004.

Although it is not illustrated, the outer ceiling plate 1060 may be configured as a divided structure including an upper portion and a lower portion formed of a dielectric material, and the antenna modules 1071 may be accommodated in, e.g., a plurality of recesses formed at the lower portion while being spaced from each other at regular intervals along the circumferential direction. In that case, the effects of the above-described example are obtained. In other words, the etching gas is uniformly converted into a plasma, and the in-plane uniformity of the etching process is achieved.

In the above example, the plasma uniformity in the diametrical direction is improved by controlling the value of the negative DC voltage applied to the gas shower head 1004. However, the uniformity of the plasma density in the diametrical direction can be improved also by controlling the value of the microwave power supplied to each of the antenna modules 1071 while maintaining the negative DC voltage at a predetermined value. Moreover, in the above example, the amount of the plasma is uniformly distributed in the circumferential direction by controlling the microwave power supplied to each of the antenna modules 1071 in the circumferential direction. However, when the amount of the plasma has extremely small variation in the circumferential direction, the microwave of the same power level can be supplied to each of the antenna modules 1071. Furthermore, in order to improve the uniformity of the concentration of the plasma 1002 in the circumferential direction, the phase of the microwave may be controlled solely or together with the power of the microwave.

Figure 33:
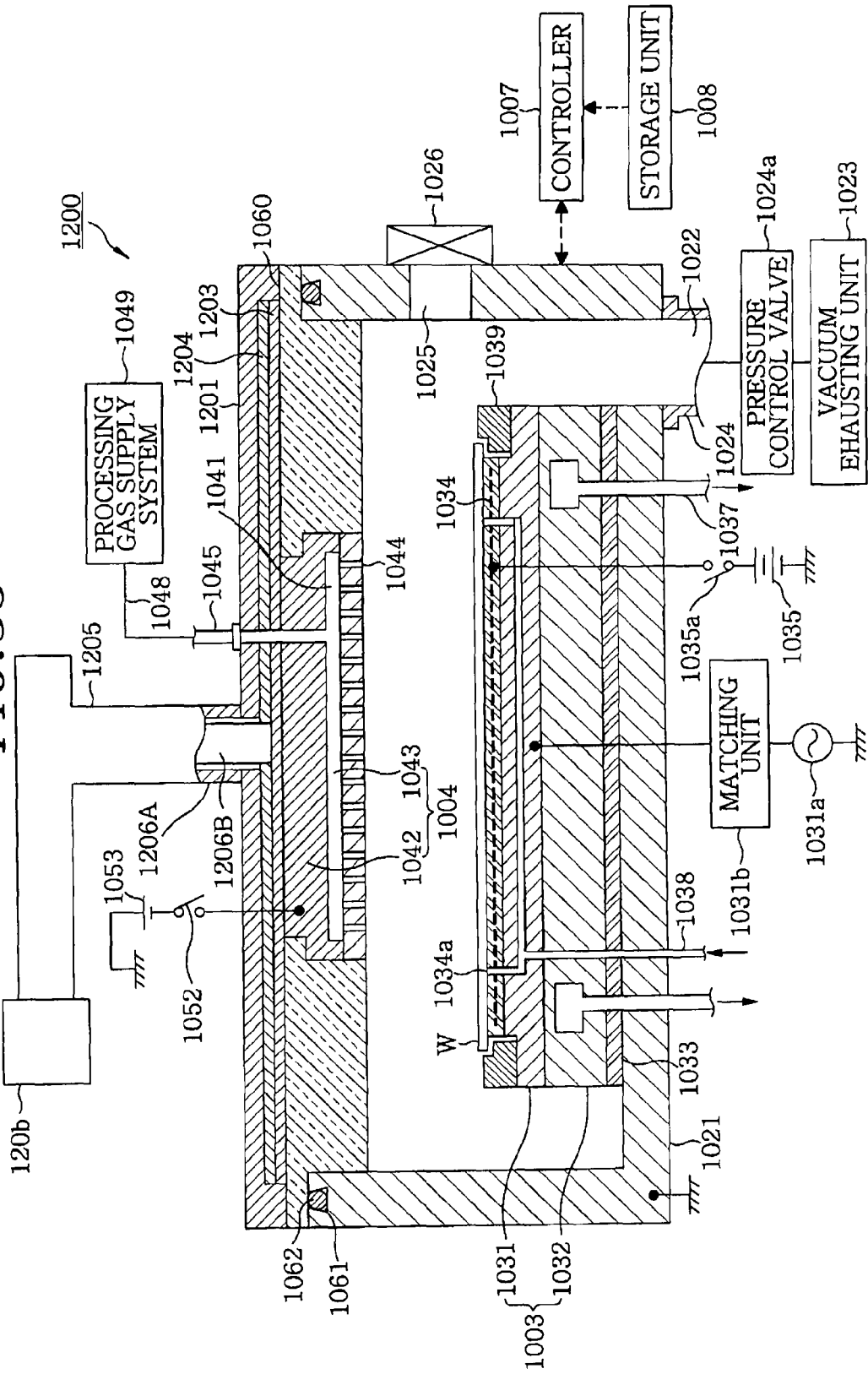
FIG. 33 is a vertical cross sectional view of still another embodiment of the plasma processing apparatus.

In the above example, a plurality of antenna modules 1071 is arranged along the circumferential direction. However, an antenna unit 1200 serving as a microwave supply unit may be provided to cover the ceiling wall (the gas shower head 1004 and the outer ceiling plate 1060) of the processing chamber 1021. This example will be described with reference to FIGS. 33 and 34. Like reference numerals will be given to like parts in the plasma etching processing apparatus of FIG. 18, and redundant description thereof will be omitted.

The antenna unit 1200 includes a flat antenna main body 1201 formed of a copper plate having a thickness of, e.g., about 1 mm, and having a circular shape viewed from above, and a planar antenna member (slot plate) 1203 having a plurality of slots 1202 for generating, e.g., a circular polarized wave. The antenna main body 1201 has a circular opening at a bottom surface thereof, and the planar antenna member 1203 blocks the opening formed at the bottom surface of the antenna main body 1201. The antenna main body 1201 and the slot member 1203 are formed of conductors, and serves as a flat circular waveguide. Moreover, the bottom surface of the planar antenna member 1203 is in close contact with the top surface (the gas shower head 1004 and the outer ceiling plate 1060) of the processing chamber 1021.

Figure 34:
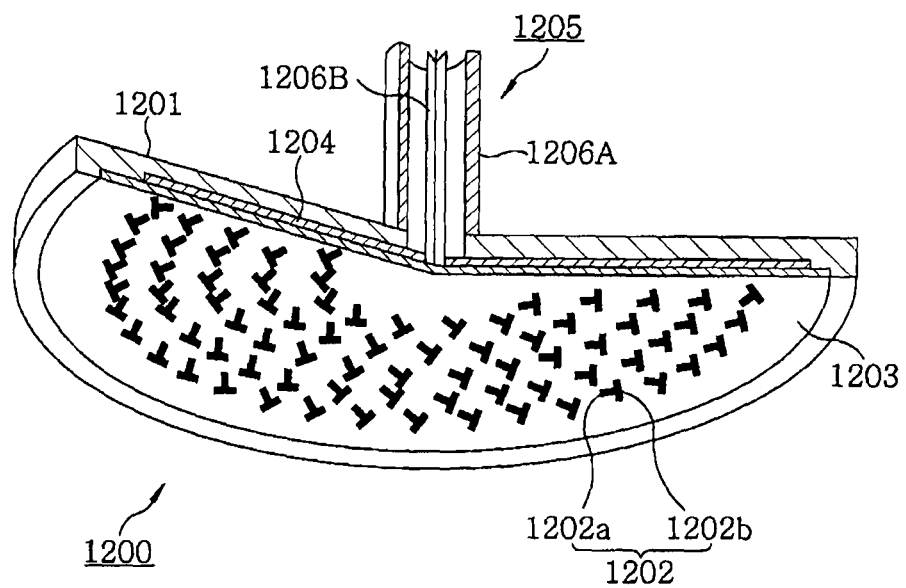
FIG. 34 is a perspective view showing an antenna portion of the embodiment shown in FIG. 33.

As shown in FIG. 34, a plurality of slots 1202, each having a pair of slots 1202*a* and 1202*b* disposed in a substantially T shape with a slight gap therebetween, is arranged in a coaxial shape or a spiral shape along the circumferential direction. The slots 1202*a* and 1202*b* are arranged so as to be substantially perpendicular to each other, so that a circular polarized wave having two polarized wave components perpendicular to each other is radiated. At this time, the microwave is radiated as a substantially planar wave from the planar antenna member 1203 by arranging the pairs of slots 1202*a* and 1202*b* with an interval corresponding to the wavelength of the microwave compressed by a phase retardation plate 1204 to be described later.

In order to reduce the wavelength of the microwave in the circular waveguide, the phase retardation plate 1204 formed of a low-loss dielectric material, e.g., aluminum oxide ($Al_2O_3$), silicon nitride ($Si_3N_4$) or the like, is installed between the planar antenna member 1203 and the antenna main body 1201. The antenna main body 1201, the planar antenna member 1203 and the phase retardation plate 1204 constitute a radial line slot antenna.

A microwave generating unit 1206 is connected to the top surface of the antenna unit 1200 via the coaxial waveguide 1205. Therefore, the microwave having a frequency of, e.g., 2.45 GHz or 8.3 GHz, is supplied to the antenna unit 1200. The coaxial waveguide 1205 includes an outer waveguide 1206A and an inner central conductor 1206B. The waveguide 1206A is connected to the antenna main body 1201, and the central conductor 1206B is connected to the planar antenna member 1203 via an opening formed at the phase retardation plate 1204.

Figure 35:
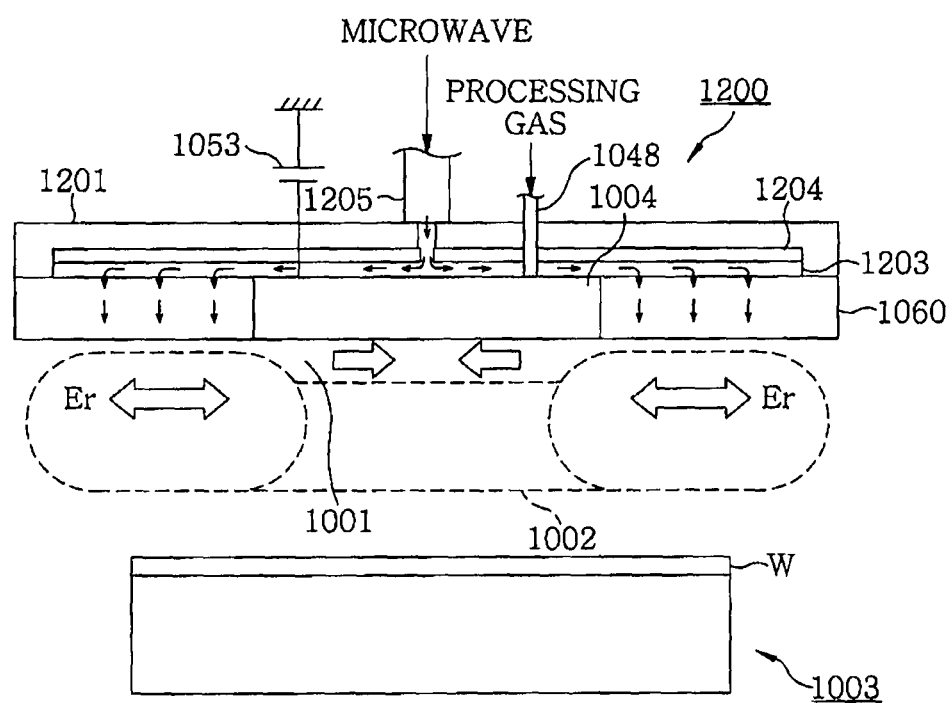
FIG. 35 is a schematic view showing a state in which an etching gas is turned into a plasma in the embodiment shown in FIG. 33.

In this plasma etching apparatus, the microwave having a frequency of, e.g., 2.45 GHz, is supplied at a power level of about 500 W to 3000 W from the microwave generating unit 1206. The microwave propagates through the coaxial waveguide 1205 in a TM mode or TE mode and reaches the planar antenna member 1203 of the antenna unit 1200. As shown in FIG. 35, the microwave propagates radially from the central portion of the planar antenna member 1203 toward the peripheral portion thereof and is emitted through the slots 1202*a* and 1202*b* into the processing chamber 1201 via the outer ceiling plate 1060. Accordingly, an electric field Er is uniformly generated along the circumferential direction in the peripheral region surrounding the space below the gas shower head 1004. Further, as in the above example, the electric field Er is strongly attracted by the DC sheath 1101 generated below the gas shower head 1004 by applying a negative DC voltage of, e.g., about 0 V to −2000 V, from the DC power supply 1053. Hence, as in the above example, the plasma is uniformly generated across the surface (in the circumferential and the diametrical direction), and an etching process is carried out with high verticality. As a result, this plasma etching processing apparatus can also provide the same effect as that of the examples described above.

In this case, as shown in FIG. 32, the openings 1120 may be formed at the outer ceiling plate 1060 along the circumferential direction. Or, a ring-shaped opening may be formed so as to surround the gas shower head 1004 without providing the outer ceiling plate 1060. In that case, the gas shower head 1004 is fixed to the antenna unit 1200, and the lower circumferential surface of the antenna main body 1201 and the upper circumferential surface of the processing chamber 1021 are brought into airtight contact with each other. Further, the technical scope of the present invention includes the case where the shower plate (the supporting member 1043) of the gas shower head 1004 in the processing region is formed of a conductive material and a negative voltage is applied to the shower plate connected to the DC power supply 1053 via the conductive path.

In the above examples, an etching process is described as an example of a plasma process. However, the plasma processing apparatus of the present invention may be applied to, e.g., a film forming apparatus employing a CVD (Chemical Vapor Deposition) method using a plasma or an ashing apparatus. For example, in a film forming apparatus, a value of a negative DC voltage applied to the gas shower head 4 is adjusted in accordance with processing conditions such as a type or a flow rate of a film forming gas, a pressure and the like, to thereby perform a film forming process at a uniform film forming rate across the surface.

(Simulation)

As shown in FIG. 35, the simulation (calculation) using COMSOL as an electromagnetic field calculation software was performed to monitor the change in the density distribution of the electric field Er (TM mode electric field) generated in the processing chamber 1021 in the case of installing the antenna modules 1071 and applying a negative DC voltage to the gas shower head 1004.

The calculation was performed in the case where microwaves having a frequency of, e.g., 1.8 GHz, were supplied to the antenna modules 1071 at a power level of about 2000 W. Further, the calculation was performed in the cases where the DC sheaths 1001 having different thicknesses of about 1 mm, 5 mm and 10 mm were generated below the gas shower head 1004 by applying a negative DC voltage to the gas shower head 1004. Moreover, the intensity of the electric field absorbed by the plasma (processing gas) was monitored in the right half space of the processing chamber 1021. The electron density of the plasma below the DC sheath 1001 can be evaluated by the absorbed electric field intensity.

(Result)

Figure 36:
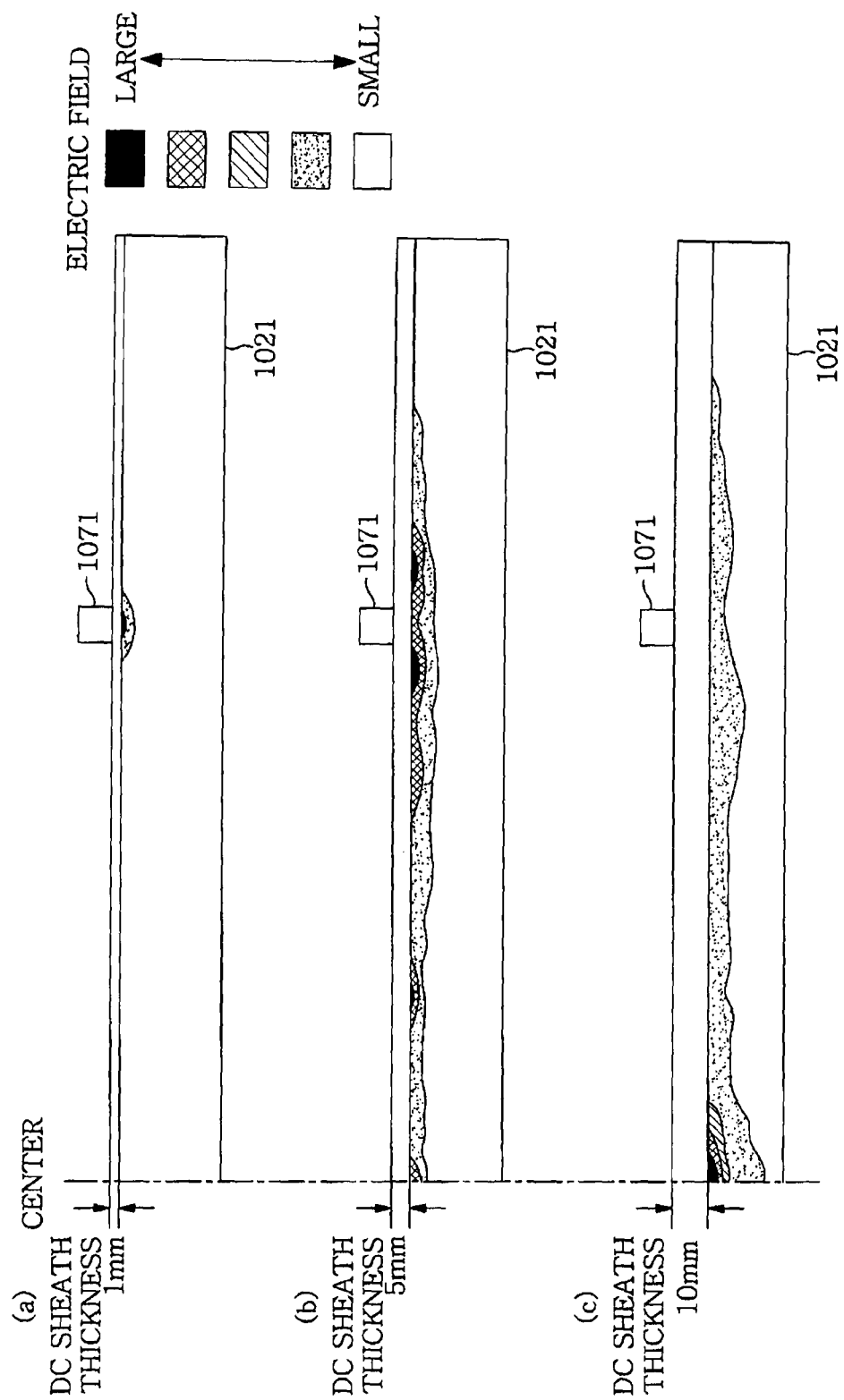
FIG. 36 is a characteristic view of the present embodiment.

As shown in (a) and (b) of FIG. 36, as the thickness of the DC sheath 1001 was increased from about 1 mm to about 5 mm, the region of the absorbed electric field intensity was extended under the region below the DC sheath 1001 to the central portion of the processing chamber 1021. From this, it was found that the electric filed Er was extended toward the central portion of the wafer W, which led to improvement of the in-plane uniformity of the plasma density. Further, (c) of FIG. 36 showed that the electric field Er generated below the antenna modules 1071 was further drawn toward the central portion of the wafer W by increasing the thickness of the DC sheath 1001, i.e., increasing the negative DC voltage applied to the gas shower head 1004.

What is claimed is:

1. A plasma processing apparatus for processing a substrate by using a plasma, comprising:
    a processing chamber;
    a mounting table, provided in the processing chamber, for mounting thereon a substrate;
    a gas shower head formed of a conductive material provided to face the mounting table, the gas shower head having at a bottom surface thereof a plurality of gas injection openings for supplying a processing gas into the processing chamber;
    an induction coil to which a high frequency current is supplied to generate an inductively coupled plasma in a region surrounding a space below the gas shower head;
    a negative voltage supply unit for applying a negative DC voltage to the gas shower head to allow an electric field induced by the induction coil to be drawn to a central portion in a processing region; and
    a unit for evacuating the processing chamber.

2. The plasma processing apparatus of claim 1, wherein the induction coil is wound around an axis extending in a direction parallel with the substrate and perpendicular to a diametrical direction of the processing chamber.

3. The plasma processing apparatus of claim 1, wherein the induction coil is provided in a plural number along a circumferential direction of the processing chamber.

4. The plasma processing apparatus of claim 1, wherein the induction coil is wound in an angular shape having a side parallel with the substrate.

5. The plasma processing apparatus of claim 1, wherein the induction coil is provided above the processing chamber, and a ceiling wall of the processing chamber around the gas shower head is formed of a dielectric material.

6. The plasma processing apparatus of claim 1, wherein the induction coil is buried in a dielectric material and forms a part of a ceiling wall of the processing chamber.

7. The plasma processing apparatus of claim 1, wherein at least a bottom surface portion of the gas shower head is formed of silicon.

8. The plasma processing apparatus of claim 1, further comprising:
    a storage unit storing, in corresponding relationship, recipes of processes to be performed on the substrate, values of the negative DC voltage, and values of the high frequency current supplied to the induction coil; and
    a control unit for outputting a control signal by reading out a value of the negative DC voltage and a value of the high frequency current in accordance with a specific recipe from the storing unit.

9. A plasma processing method for processing a substrate by a plasma, comprising:
    mounting a substrate on a mounting table in a processing chamber;
    forming an electric field in a region surrounding a space below a gas shower head formed of a conductive material and disposed to face the mounting table by supplying a high frequency current to an induction coil positioned outwardly of the gas shower head in a diametrical direction of the processing chamber;
    supplying a processing gas into the processing chamber through gas injection openings formed at a bottom surface of the gas shower head to allow the processing gas to be converted into a plasma by the electric field; and applying a negative DC voltage to the gas shower head to allow the electric field induced by the induction coil to be drawn to the central portion of a processing region.

10. The plasma processing method of claim 9, wherein the induction coil is wound around an axis extending in a direction parallel with the substrate and perpendicular to the diametrical direction of the processing chamber.

11. The plasma processing method of claim 9, wherein the induction coil is provided in a plural number along the circumferential direction of the processing chamber.

12. The plasma processing method of claim 9, wherein the induction coil is wound in an angular shape having a side parallel with the substrate.

13. The plasma processing method of claim 9, further comprising reading out a value of a negative DC voltage and a value of a high frequency current supplied to the induction coil in accordance with a specific recipe from a storage unit storing, in corresponding relationship, recipes of processes to be performed on the substrate, values of the negative DC voltage and values of the high frequency current supplied to the induction coil.

14. A plasma processing apparatus for processing a substrate by a plasma, comprising:
   a mounting table, provided in a processing chamber, for mounting thereon a substrate;
   a gas shower head formed of a conductive material provided to face the mounting table, the gas shower head having at a bottom surface a plurality of gas injection openings for supplying a processing gas into the processing chamber;
   a microwave supply unit to which microwaves are supplied to convert a processing gas into a plasma in a region surrounding a space below the gas shower head;
   a negative voltage supply unit for applying a negative DC voltage to the gas shower head to allow an electric field induced by the microwave to be drawn to a central portion of a processing region; and
   a unit for evacuating the processing chamber.

15. The plasma processing apparatus of claim 14, wherein the microwave supply unit is provided in a plural number along the circumferential direction of the processing chamber.

16. The plasma processing apparatus of claim 14, wherein a ceiling wall of the processing chamber around the gas shower head is formed of a dielectric material, and the microwave supply unit is provided above the ceiling wall.

17. The plasma processing apparatus of claim 14, wherein an opening is formed at a ceiling wall of the processing chamber, the opening being positioned below the microwave supply unit and around the gas shower head, and the microwave supply unit is airtightly provided at the processing chamber to block the opening.

18. The plasma processing apparatus of claim 14, further comprising:
   a storage unit storing, in corresponding relationship, recipes of processes to be performed on the substrate and values of the negative DC voltage;
   a control unit for outputting a control signal by reading out a value of the negative DC voltage in accordance with a specific recipe from the storing unit.

19. The plasma processing apparatus of claim 14, further comprising:
   a storage unit storing, in corresponding relationship, recipes of processes to be performed on the substrate, values of the negative DC voltage, and values of the microwave power supplied to the microwave supply unit; and
   a control unit for outputting a control signal by reading out a value of the negative DC voltage and a value of the microwave power in accordance with a certain recipe from the storing unit.

20. The plasma processing apparatus of claim 19, wherein the microwave supply unit is provided in a plural number along the circumferential direction of the processing chamber; the storage unit stores, in corresponding relationship, recipes and values of the microwave power supplied to each of the microwave supply units; and the control unit outputs a control signal by reading out a value of the microwave power supplied to each of the microwave supply units in accordance with the recipe.

* * * * *